US006760895B2

(12) United States Patent
Ito et al.

(10) Patent No.: US 6,760,895 B2
(45) Date of Patent: Jul. 6, 2004

(54) DESIGN METHOD OF SEMICONDUCTOR DEVICE

(75) Inventors: Yuko Ito, Hamura (JP); Satoru Isomura, Hamura (JP)

(73) Assignee: Hitachi, Ltd., Tokyo (JP)

(*) Notice: Subject to any disclaimer, the term of this patent is extended or adjusted under 35 U.S.C. 154(b) by 58 days.

(21) Appl. No.: 10/147,991

(22) Filed: May 20, 2002

(65) Prior Publication Data

US 2003/0217344 A1 Nov. 20, 2003

(51) Int. Cl.[7] .............................................. G06F 9/45
(52) U.S. Cl. ............................................. 716/10; 716/6
(58) Field of Search .............................. 716/5, 6, 9, 10, 716/19; 703/2, 4

(56) References Cited

U.S. PATENT DOCUMENTS

| 5,446,674 | A |   | 8/1995  | Ikeda et al. ........... 364/489 |
|-----------|---|---|---------|--------------------------------|
| 5,469,366 | A | * | 11/1995 | Yang et al. ............... 716/6 |
| 5,761,076 | A | * | 6/1998  | Miki ....................... 716/5 |
| 5,787,008 | A | * | 7/1998  | Pullela et al. ............ 703/19 |
| 5,790,415 | A | * | 8/1998  | Pullela et al. ............. 716/6 |
| 6,314,546 | B1 | * | 11/2001 | Muddu ..................... 716/5 |
| 6,353,917 | B1 | * | 3/2002  | Muddu et al. .............. 716/6 |
| 6,405,350 | B1 | * | 6/2002  | Tawada .................... 716/5 |
| 6,418,401 | B1 | * | 7/2002  | Dansky et al. ........... 703/27 |
| 6,434,731 | B1 | * | 8/2002  | Brennan et al. .......... 716/10 |
| 6,496,960 | B1 | * | 12/2002 | Kashyap et al. ........... 716/4 |
| 6,510,404 | B1 | * | 1/2003  | Kuriyama et al. ......... 703/6 |
| 6,530,066 | B1 | * | 3/2003  | Ito et al. .................. 716/5 |
| 6,536,022 | B1 | * | 3/2003  | Aingaran et al. ........... 716/5 |
| 6,550,050 | B2 | * | 4/2003  | Hosono et al. ........... 716/13 |
| 6,594,805 | B1 | * | 7/2003  | Tetelbaum et al. ......... 716/5 |

FOREIGN PATENT DOCUMENTS

| JP | 5-342305  | 12/1993 |
|----|-----------|---------|
| JP | 6-120343  | 4/1994  |
| JP | 8-6990    | 1/1996  |
| JP | 8-77243   | 3/1996  |
| JP | 8-110915  | 4/1996  |
| JP | 11-97539  | 4/1999  |
| JP | 11-259544 | 9/1999  |

* cited by examiner

Primary Examiner—Stacy A. Whitmore
(74) Attorney, Agent, or Firm—Miles & Stockbridge P.C.

(57) ABSTRACT

A semiconductor device design method useful for the design of microprocessor, ASIC, and high-speed high-performance LSI is intended to enhance the accuracy of delay calculation and crosstalk noise calculation, and enhance the accuracy of assessment of delay variation caused by crosstalk and checking of malfunctioning caused by crosstalk. The method calculates the delay by using the total capacitance in consideration of the actual load after the layout and wiring, carries out the layout, wiring and modification of wiring repeatedly until targeted in-cycle transfer becomes attainable, calculates the delay by using the total capacitance in consideration of the actual load and crosstalk, carries out the modification of wiring repeatedly until targeted in-cycle transfer becomes attainable, calculates the crosstalk noise by using the total capacitance and coupling capacitance in consideration of the actual load, carries out the modification of wiring repeatedly until malfunctioning subsides, and uses data after the final layout and wiring for mask data.

15 Claims, 21 Drawing Sheets

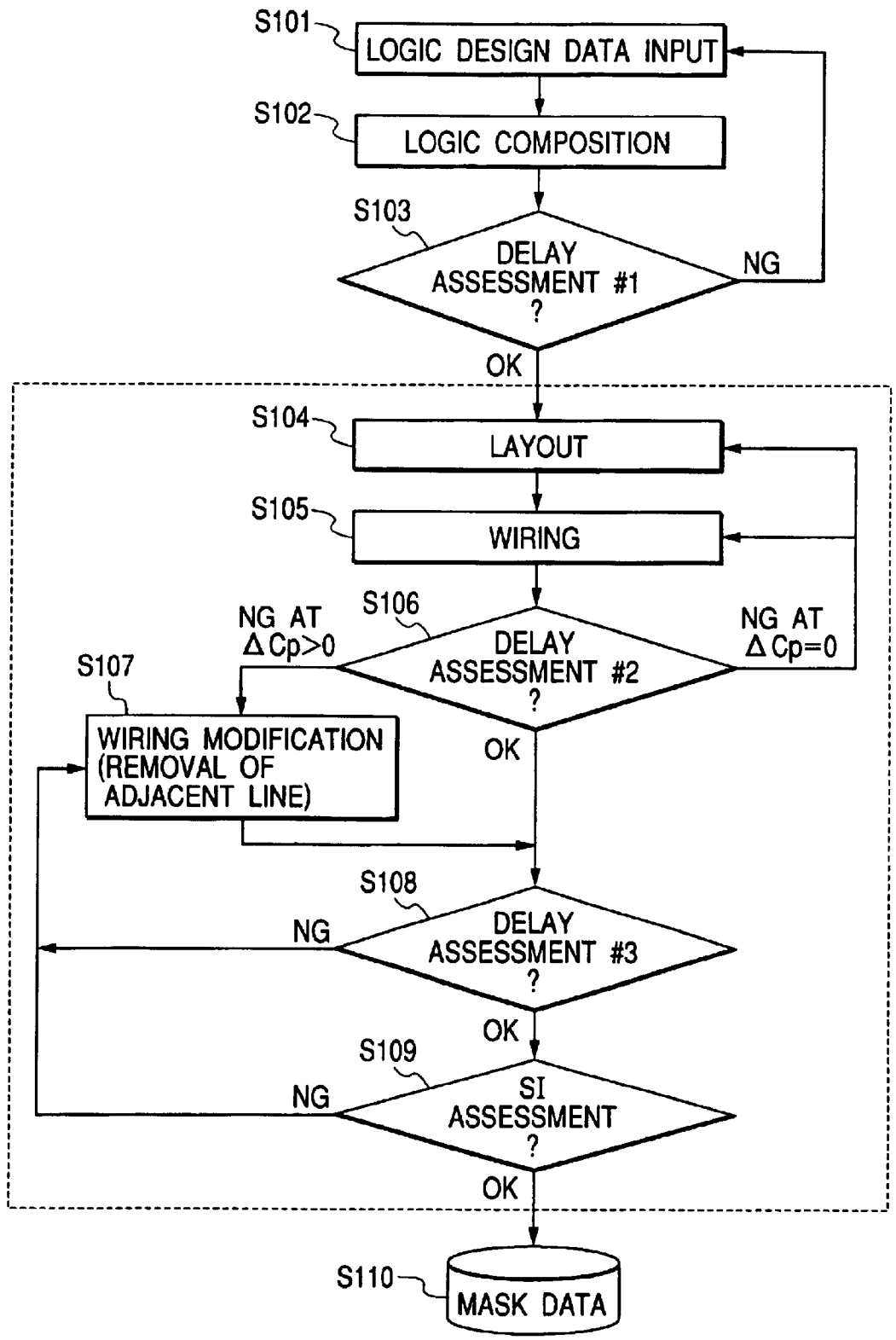

SLACK DISTRIBUTION
OBTAINED AT $\Delta Cp=0$

SLACK DISTRIBUTION
OBTAINED AT $\Delta Cp>0$

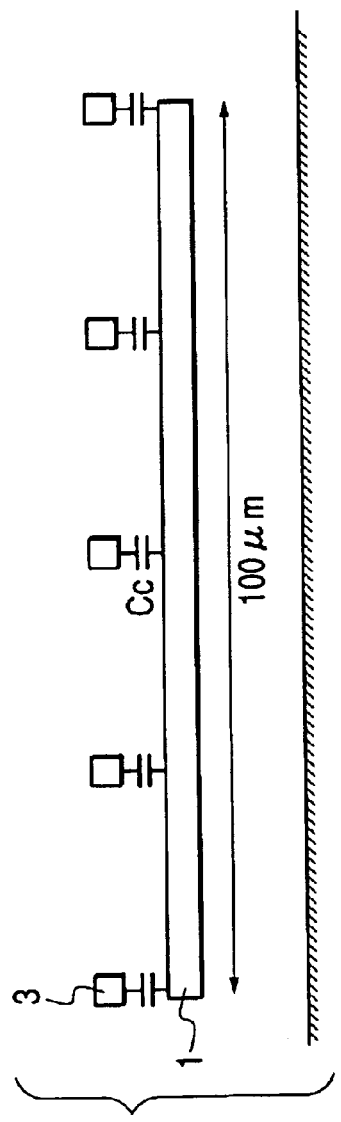
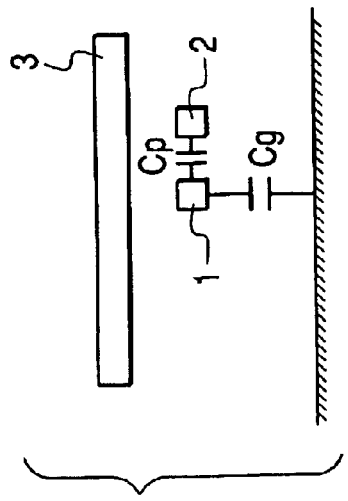

|  | | MODULUS OF CROSSING | | | |
|---|---|---|---|---|---|
|  | | 0% | 33% | 67% | 100% |
| MODULUS OF PARALLELISM | 0% (NO ADJACENT LINE) | (a-i) | (a-ii) | (a-iii) | (a-iv) |
| | 100% (ADJACENT LINE ON ONE SIDE) | (b-i) | (b-ii) | (b-iii) | (b-iv) |
| | 200% (ADJACENT LINES ON BOTH SIDES) | (c-i) | (c-ii) | (c-iii) | (c-iv) |

DESIGN METHOD OF SEMICONDUCTOR DEVICE

BACKGROUND OF THE INVENTION

The present invention relates to a design technique of semiconductor devices, and particularly to a technique applied effectively to the design of semiconductor devices with the intention of enhancing the accuracy of delay calculation and crosstalk noise calculation and enhancing the accuracy of assessment of delay variation caused by crosstalk and checking of malfunctioning caused by crosstalk.

According to the study on the design of semiconductor devices by the inventors of the present invention, it is necessary for the calculation of signal delay in an LSI device to evaluate the load capacitance of lines. Techniques pertaining to the calculation of line capacitance are described in Japanese Patent Unexamined Publications No. Hei 8(1996)-110915, No. Hei 6(1994)-120343, No. Hei 11(1999)-97539, No. Hei 11(1999)-259544, and No. Hei 5(1993)-342305, for example.

(1) The patent publication No. Hei 8(1996)-110915 discloses a technique of calculating the moduli of parallelism and moduli of crossing of all nets and evaluating a typical value of line capacitance based on the modulus of parallelism and modulus of crossing appearing frequently.

(2) The patent publication No. Hei 6(1994)-120343 discloses a technique of evaluating the line capacitance based on the pattern matching with numerous pattern models having their capacitance calculated in advance.

(3) The patent publication No. Hei 11(1999)-97539 discloses a technique of evaluating the degree of crosstalk (capacitance) based on the layout of parallel or cross lines of same or different layers.

(4) The patent publication No. Hei 11(1999)-259544 discloses a technique of calculating the capacitance factor based on the peripheral condition in terms of the distance to adjacent lines and cross lines.

(5) The patent publication No. Hei 5(1993)-342305 discloses a technique of calculating the capacitance between lines from parallel or overlapping line segments, thereby assessing the degree of crosstalk.

SUMMARY OF THE INVENTION

In regard to the above-mentioned techniques of calculating the line capacitance, the study by the inventors of the present invention has revealed the following affairs.

(1) The technique of the patent publication No. Hei 8(1996)-110915 is intended to evaluate the typical value of line capacitance from frequent moduli of parallelism and crossing of lines, instead of calculating the capacitance value based on the modulus of parallelism and modulus of crossing of each net or segment. It does not consider the variation of coupling capacitance with adjacent lines, besides the line-to-ground capacitance, depending on the modulus of crossing.

(2) The technique of the patent publication No. Hei 6(1994)-120343 is intended to evaluate the line capacitance based on pattern matching, instead of dealing with neighboring lines as parameters in terms of the modulus of parallelism and modulus of crossing. Accordingly, it compels to deal with a large amount of pattern data. Moreover, it can merely calculate the capacitance values of lines having their pattern data registered, and it does not consider the formulation of patterns into functions so as to facilitate the matching process.

(3) The technique of the patent publication No. Hei 11(1999)-97539 basically deals with the capacitance of parallel flat conductors in evaluating the degree of crosstalk, and it does not consider neighboring lines in different densities.

(4) The technique of the patent publication No. Hei 11(1999)-259544, which resembles the technique of No. Hei 6(1994)-120343 in evaluating the line capacitance based on pattern matching, does not deal with neighboring lines as parameter in terms of moduli of parallelism and crossing. Accordingly, it compels to deal with a large amount of pattern data. Moreover, it can merely calculate the capacitance of lines having their pattern data registered, and it does not consider the formulation of patterns into functions so as to facilitate the matching process.

(5) The technique of the patent publication No. Hei 5(1993)-342305, which resembles the technique of No. Hei 11(1999)-97539 in evaluating the degree of crosstalk by dealing with the capacitance of parallel flat conductors, does not consider neighboring lines in different densities.

Generally, the calculation of line capacitance for the purpose of calculating the signal propagation delay is based on the assumption of grounding of all lines except for the subject line. However, if the influence of crosstalk is taken into consideration, it is necessary to evaluate the coupling capacitance between the subject line and a noise-source parallel line and the line-to-ground capacitance with the assumption of grounding of all other lines.

The conventional techniques do not consider the coupling capacitance, or assume a constant coupling capacitance regardless of the density of neighboring lines, and therefore the accuracy of assessment of delay variation and checking of malfunctioning caused by crosstalk is not adequate. The increase of line-to-ground capacitance due to parallel lines is disregarded, even in the case of considering the coupling capacitance, and it is necessary for the evaluation of total capacitance, with parallel lines being removed, to make in advance a net list excluding the parallel lines and redo the calculation.

The calculation of total capacitance in consideration of the density of neighboring lines and the calculation of coupling capacitance are becoming particularly crucial in recent trends of microstructured wiring resulting from high-integration chips. Specifically, for minimizing the increase of line resistance, the line thickness cannot be made much smaller in exchange for the reduction of line width, which results in such a large aspect ratio (vertical-to-horizontal dimensional ratio) of line cross section of 1 or larger. Conventional flat lines have large proportions of the capacitance of parallel flat conductors, allowing the accurate evaluation of capacitance based on the multiplication of unit values of parallel and cross capacitance between layers and between lines evaluated in advance to overlapping areas and parallel distances of lines. Whereas, in regard to recent lines with large aspect ratios, the unit value of parallel capacitance varies depending on the density of neighboring cross lines, i.e., adjacent lines and cross lines have their capacitance values affecting each other.

On this account, the scheme of evaluating the capacitance of lines formed by automatic layout and wiring based on the search for the most-like pattern in a pattern library, as in the case of the above-mentioned prior art (e.g., No. Hei 6(1994)-120343) necessitates a huge amount of pattern data to be registered in the library by expending impractical time of several months.

The inventors of the present invention have found an effective scheme of enhancing the accuracy of calculation of the signal propagation delay caused by the line load, the accuracy of assessment of the delay variation caused by crosstalk, and the accuracy of checking of malfunctioning caused by crosstalk. The scheme is based on the registration of capacitance values in relation with parameters in terms of the modulus of parallelism and modulus of crossing unique to layouts of subject line (segment), instead of conducting the pattern matching mentioned above.

Accordingly, it is an object of the present invention to provide a design method of semiconductor device capable of accomplishing the enhancement of the accuracy of delay calculation and crosstalk noise calculation and the enhancement of the accuracy of assessment of delay variation caused by crosstalk and checking of malfunctioning caused by crosstalk.

These and other objects and novel features of the present invention will be apparent from the following description and accompanying drawings.

Among the affairs of the present invention disclosed in this specification, representatives are briefed as follows.

The inventive design method adopts the scheme of evaluating the line-to-ground capacitance and coupling capacitance to be used for the delay calculation by basing the enhancement of evaluation accuracy on the neighboring line density. The inventive method defines the line-to-ground capacitance separately in terms of a base capacitance inherent to the existence of subject line, a cross capacitance increment caused by cross lines, and a parallel capacitance increment caused by adjacent lines. The inventive method evaluates the coupling capacitance in consideration of the modulus of crossing, evaluates the increment of line-to-ground capacitance caused by adjacent lines in consideration of the modulus of crossing, and separates the increment of line-to-ground capacitance value of adjacent lines, thereby evaluating the line-to-ground capacitance, with the parallel lines being removed, without the need of altering the net list.

More specifically, the inventive semiconductor device design method calculates the signal propagation delay by using the total capacitance (Ctotal) with the assumption of grounding of all lines except for the subject line in consideration of the actual load after the layout and wiring, checks the attainability of targeted in-cycle data transfer, repeats the layout and wiring until the targeted in-cycle data transfer becomes attainable, calculates the signal propagation delay by using the total capacitance (Ctotal) in consideration of the actual load after the layout and wiring, checks the attainability of targeted in-cycle transfer, repeats the modification of wiring until the targeted in-cycle transfer becomes attainable, calculates the level of crosstalk noise by using the total capacitance (Ctotal) and coupling capacitance (Cp) between the subject line and adjacent lines in consideration of the actual load after the layout and wiring, checks the occurrence of malfunctioning, repeats the modification of wiring until malfunctioning subsides, and uses the final data after the layout and wiring for mask data.

The inventive semiconductor device design method further evaluates the capacitance increment ($\Delta Cp$) of the total capacitance (Ctotal) for the cases with and without adjacent lines of the subject line, modifies the layout and line routing for a net having a negative slack even in the case without adjacent lines and no capacitance increment ($\Delta Cp=0$), and removes adjacent lines for a net having a negative slack of the case with adjacent lines and with a capacitance increment ($\Delta Cp>0$), even though it has no negative slack in the case without adjacent lines and no capacitance increment ($\Delta Cp=0$).

The inventive semiconductor device design method registers in a table in advance total capacitance values of unit length in relation with parameters in terms of the modulus of parallelism and modulus of crossing, registers in tables in advance coupling capacitance values of unit length and capacitance increment values of unit length in relation with a parameter in terms of the modulus of crossing, calculates the actual modulus of parallelism and modulus of crossing from layout data after the layout and wiring, evaluates the total capacitance of unit length corresponding to the calculated modulus of parallelism and modulus of crossing and the coupling capacitance and capacitance increment of unit length corresponding to the modulus of crossing evaluated based on the interpolation or extrapolation process for table data, and multiplies the length of subject line to these unit values, thereby evaluating the total capacitance (Ctotal), coupling capacitance (Cp) and capacitance increment ($\Delta Cp$)

BRIEF DESCRIPTION OF THE DRAWINGS

FIG. 1 is a flowchart showing the semiconductor device design method based on an embodiment of this invention;

FIGS. 7A and 7B are diagrams used to explain the calculation of capacitance of unit length based on an embodiment of this invention;

DESCRIPTION OF THE PREFERRED EMBODIMENTS

Embodiments of this invention will be explained in detail with reference to the drawings. Throughout the figures, identical items are referred to by the common symbols, and explanation thereof are not repeated.

Figure 2A:
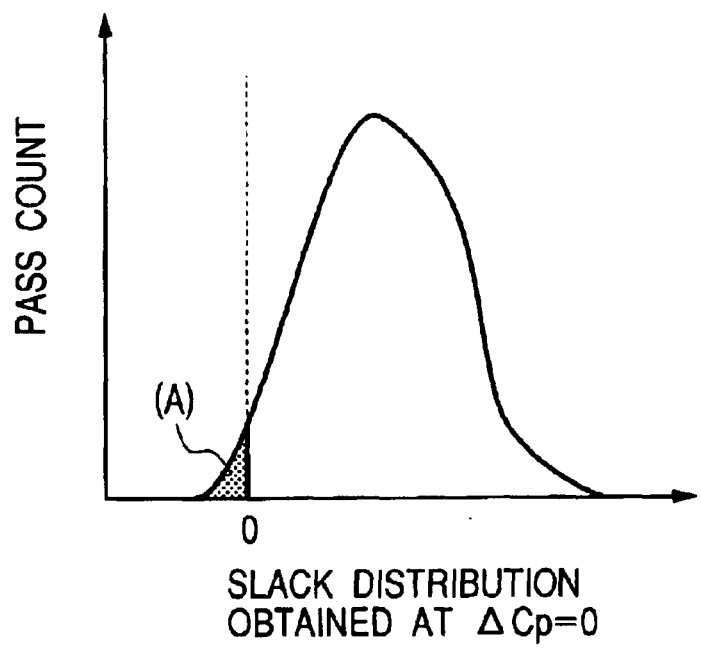
FIGS. 2A and 2AB are characteristic graphs showing the slack distributions obtained for the cases with and without adjacent lines of the subject line based on a an embodiment of this invention.
Figure 2B:
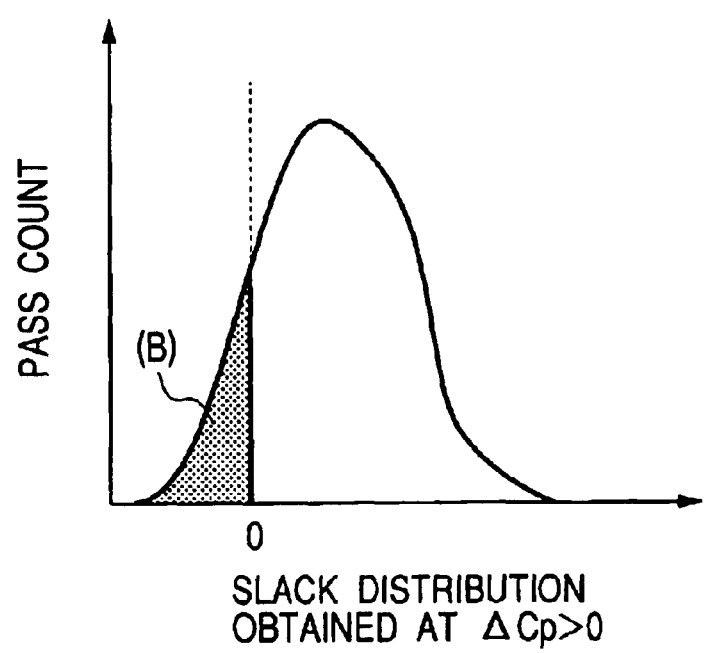

The semiconductor device design method based on an embodiment of this invention will be explained with reference to FIG. 1 and FIGS. 2A and 2B. FIG. 1 is a flowchart showing the semiconductor device design method based on an embodiment of this invention, and FIGS. 2A and 2B are characteristic graphs showing the slack distributions obtained for the cases with and without adjacent lines of the subject line based on an embodiment of this invention.

The semiconductor device dealt with by this embodiment is a high-speed high-performance LSI device which constitutes a microprocessor, ASIC device, etc. and is made up of logic gates, etc. formed basically of transistors.

The LSI device is designed in the following procedure.

(1) Logic circuit design data prepared based on the specifications of LSI device is entered to the design system, and it composes a logic circuit automatically based on the design data: (steps S101, S102).

(2) The composed logic circuit is rendered delay assessment #1 in terms of the number of gate stages as to whether the targeted in-cycle transfer is attainable:(step S103). This assessment process uses a load capacitance of a fixed value or a simple model of capacitance derived from the average value of nets. While the delay assessment #1 negates the attainability of targeted in-cycle transfer, i.e., judgement of NG, the sequence returns to repeat from data input of step S101, and the sequence proceeds to step S104 when the targeted in-cycle transfer becomes attainable.

(3) The logic circuits and circuit elements are laid out automatically based on the LSI specifications to meet the electrical characteristics of logic circuit and LSI, and automatic wiring is done to connect the circuit elements and logic circuits: (steps S104, S105).

(4) The signal propagation delay is calculated in consideration of the actual load after the layout and wiring, and delay assessment #2 is done to check whether the targeted in-cycle transfer is attainable: (step S106). For this delay calculation, the total capacitance (Ctotal) with the assumption of grounding of all lines except for the subject line is evaluated for the cases with and without adjacent lines of the subject line. The delay calculation can be based on the scheme described in Japanese Patent Unexamined Publication No. Hei 8(1996)-6990 or No. Hei 8(1996)-77243 for example. The layout and wiring or the modification of wiring is carried out repeatedly until the targeted in-cycle transfer becomes attainable for the calculated signal propagation delay.

For example, a net having a negative slack (shown by A), even though it has no capacitance increment ($\Delta Cp=0$) for the case without adjacent lines of the subject line, as shown in FIG. 2A, is determined to undergo the wiring modification or wiring route modification by returning to the step S105 or S104.

A net having a negative slack (shown by B) for the case with adjacent lines and with a capacitance increment ($\Delta Cp>0$) as shown in FIG. 2B, even though it does not have a negative slack for the case without adjacent lines of the subject line and with no capacitance increment ($\Delta Cp=0$), is determined to undergo the removal of adjacent lines for the modification of wiring:(step S107).

(5) The delay is calculated in consideration of the actual load after the layout and wiring and of crosstalk, and delay assessment #3 is done for checking whether the targeted in-cycle transfer is attainable: (step S108). This assessment process uses the total capacitance (Ctotal) with the assumption of grounding of all lines except for the subject line. The delay calculation will be explained in detail later in connection with FIG. 12 through FIG. 17. If the delay assessment #3 negates the attainability of targeted in-cycle transfer, i.e., judgement of NG, the sequence returns to repeat from wiring modification of step S107, and the sequence proceeds to step S109 when the targeted in-cycle transfer becomes attainable.

(6) The level of crosstalk noise is calculated based on the actual load after the layout and wiring, and the assessment of signal integrity (SI) is done to prove the immunity of malfunctioning:(step S109). This calculation process uses the total capacitance (Ctotal) with the assumption of grounding of all lines except for the subject line and the coupling capacitance (Cp) between the subject line and adjacent lines. The crosstalk noise calculation can be based on the scheme described in Japanese Patent Unexamined Publication No. Hei 5(1993)-342305 for example. If the SI assessment negates the immunity of malfunctioning, i.e., judgement of NG, the sequence returns to repeat from wiring modification of step S107, and the sequence proceeds to step S110 when malfunctioning subsides.

(7) Data after the layout and wiring resulting from the repetition of process until the targeted in-cycle transfer is attainable and malfunctioning subsides is used for mask data:(step S110). The mask data is used to make masks of photolithography, logic circuit patterns formed on the masks are transferred onto the wafer, and logic circuits are formed on the wafer based on the semiconductor wafer process. The wafer is cut into chips, and each chip is packaged or formed into a module by the assembly process. On the flowchart of FIG. 1, the portion enclosed by the dashed line can be treated by means of a layout/wiring tool with the timing-driven SI ability.

In the semiconductor device design method described above, the delay from the source gate input to the sink gate input is calculated by being split into: (1) the delay from the source gate input to the source gate output (D1), and (2) the delay from the source gate output to the sink gate input (D2) in the field of high-speed high-accuracy delay calculation in general.

The delay D1, which is generally called "circuit load delay", is determined from the waveform of input signal to the source gate, the load driving force of the source gate, and the load connected to the source gate (line capacitance of the net, line resistance and input capacitance of all sink gates). The circuit load delay is generally evaluated by calculating the actual load mentioned previously from the layout data, and obtaining the circuit load delay for the calculated load capacitance based on the load characteristics of source gate evaluated in advance for the subject net of delay calculation. The delay D2, which is generally called "line resistance delay", is known to be proportional to the product of the resistance between the source gate and the sink gate and load capacitance of the whole net.

The inventive semiconductor device design method is capable of evaluating the actual load delay accurately for the calculation of the circuit load delay and line resistance delay.

Figure 4:
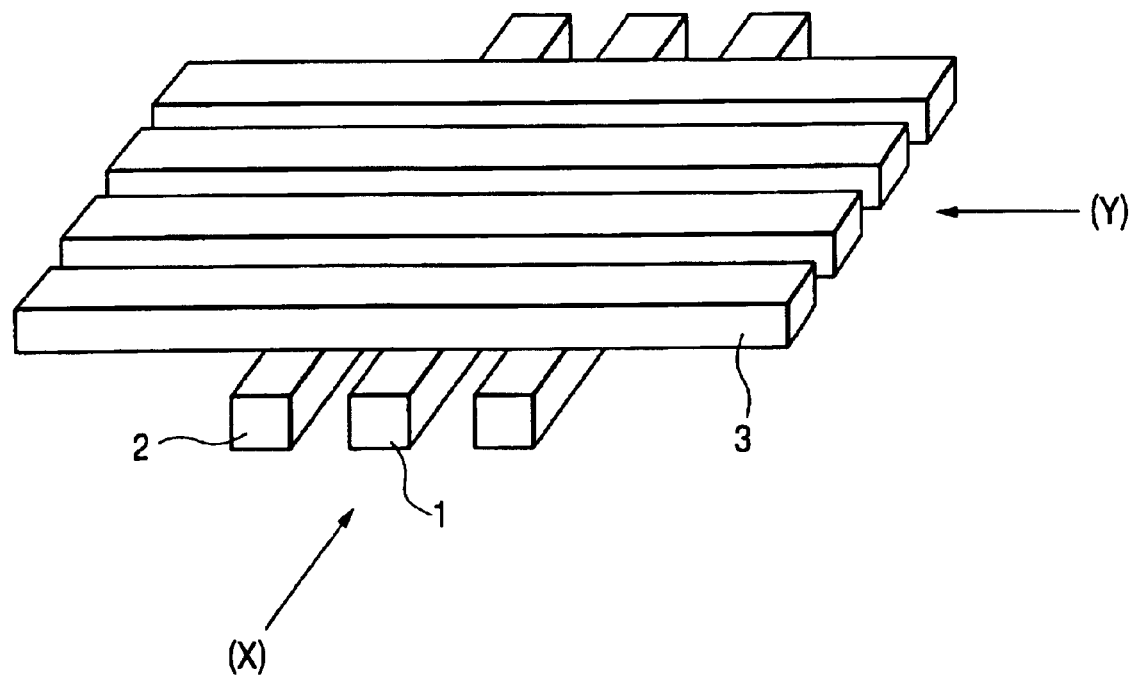
FIG. 4 is a brief perspective view of models of a subject line, adjacent lines and cross lines treated by an embodiment of this invention.
Figure 5A:
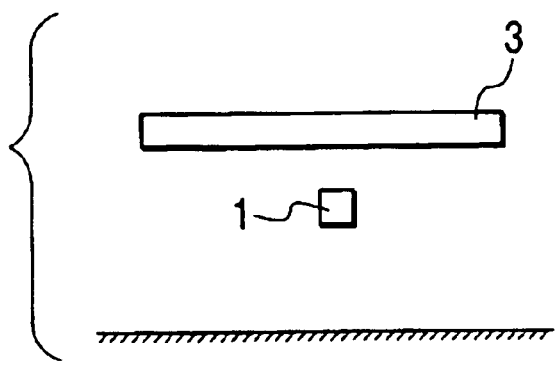
FIGS. 5A through 5C are brief cross-sectional diagrams showing models of a subject line and adjacent lines treated by an embodiment of this invention.
Figure 5B:
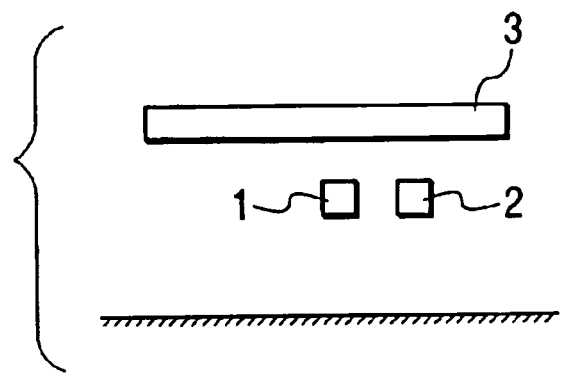
Figure 5C:
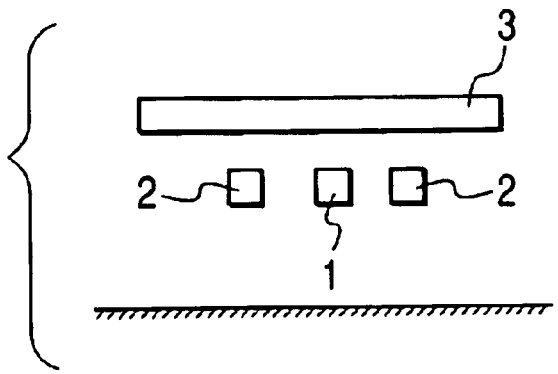
Figure 6A:
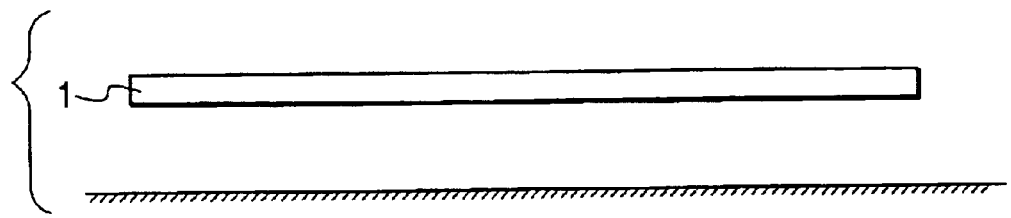
FIGS. 6A through 6D are brief cross-sectional diagrams showing models of a subject line and cross lines treated by an embodiment of this invention.
Figure 6B:
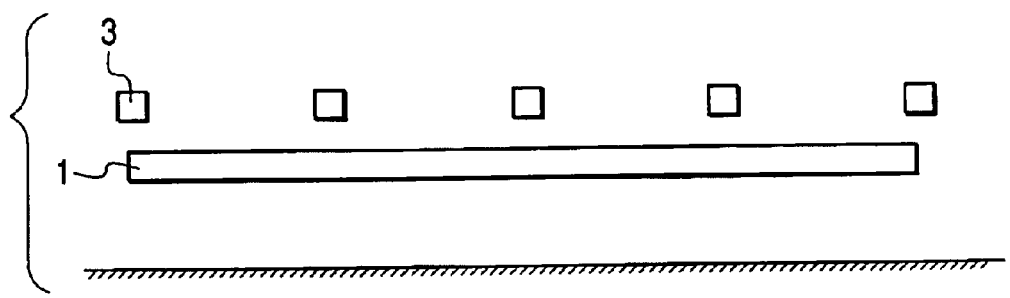
Figure 6C:
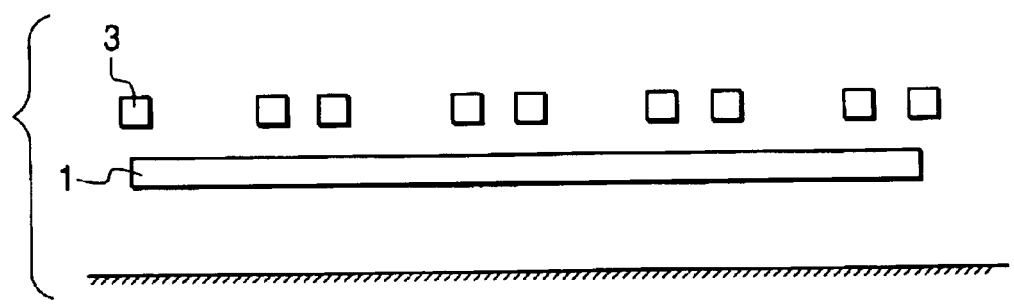
Figure 6D:
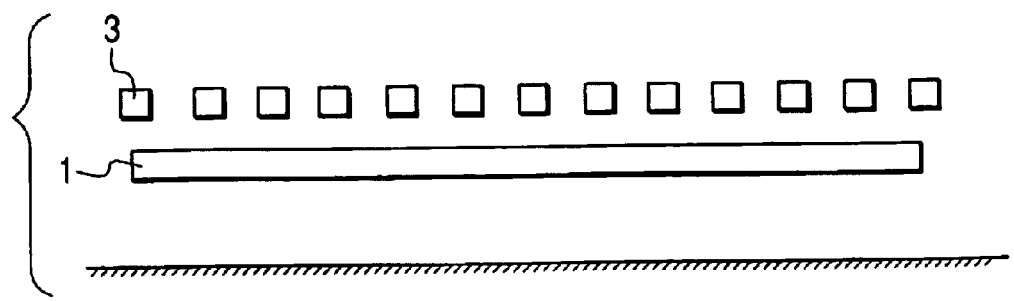
Figure 8:
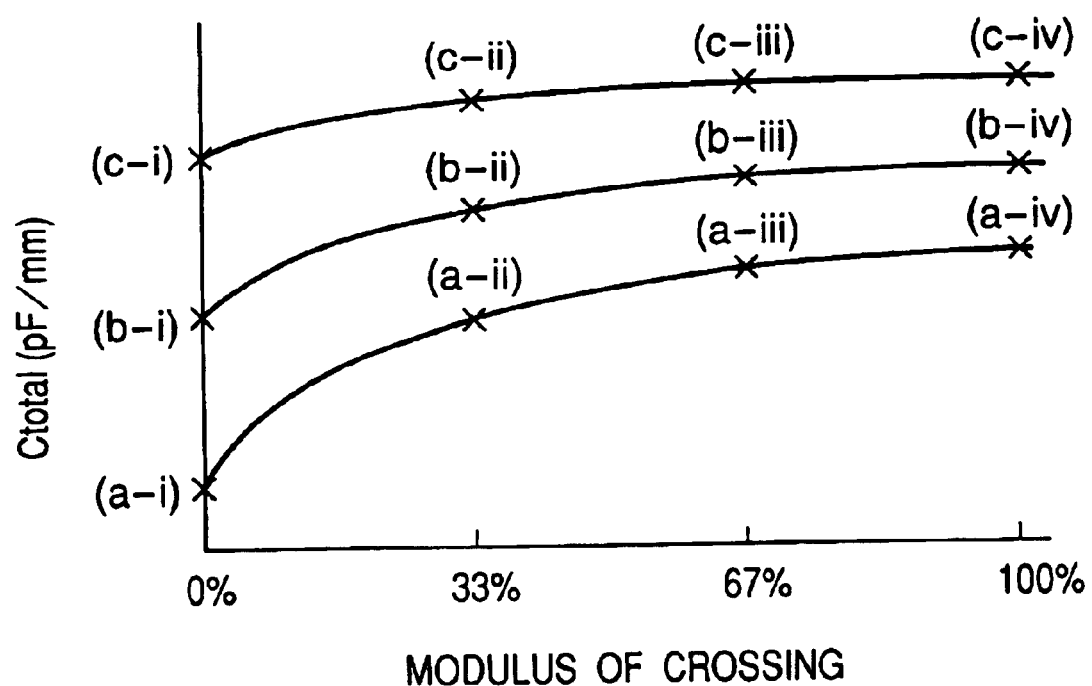
FIG. 8 is a characteristic graph showing the dependency of the subject line capacitance on adjacent lines and cross lines treated by an embodiment of this invention.
Figure 9A:
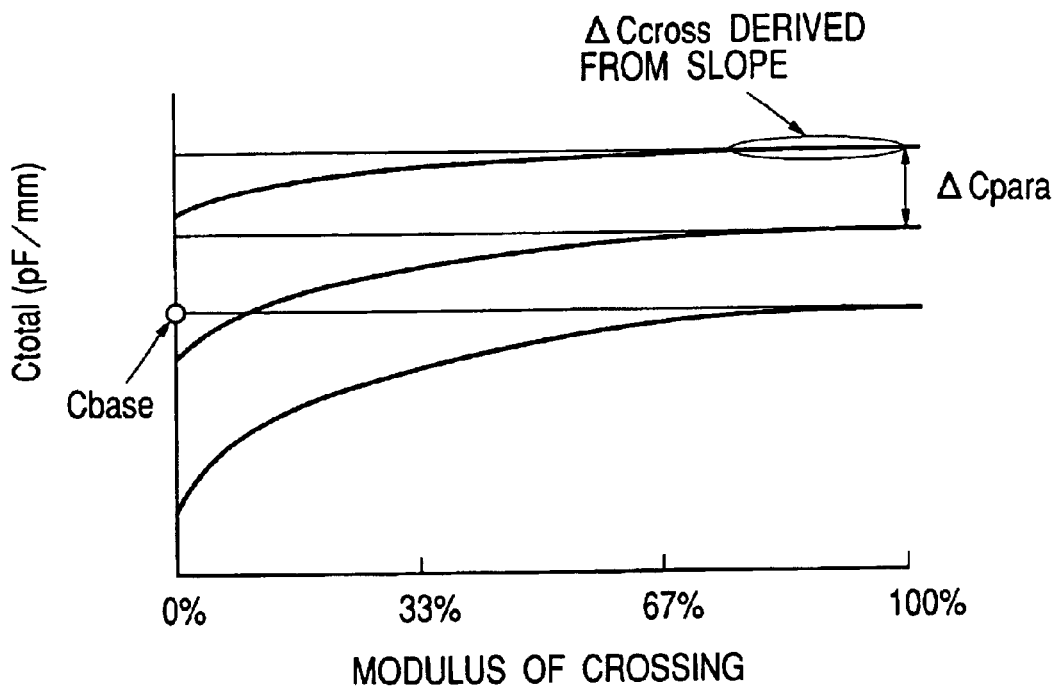
FIGS. 9A and 9B are graphs used to explain the base capacitance of the subject line, the capacitance increment caused by adjacent lines, and the capacitance increment caused by cross lines.
Figure 9B:
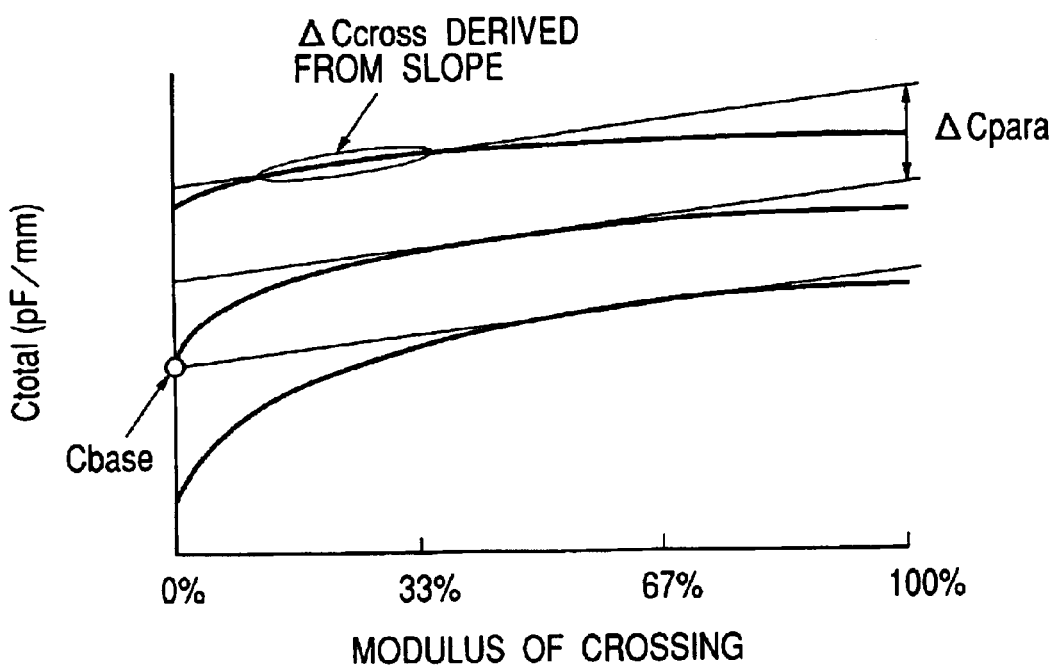
Figures 10, 11:
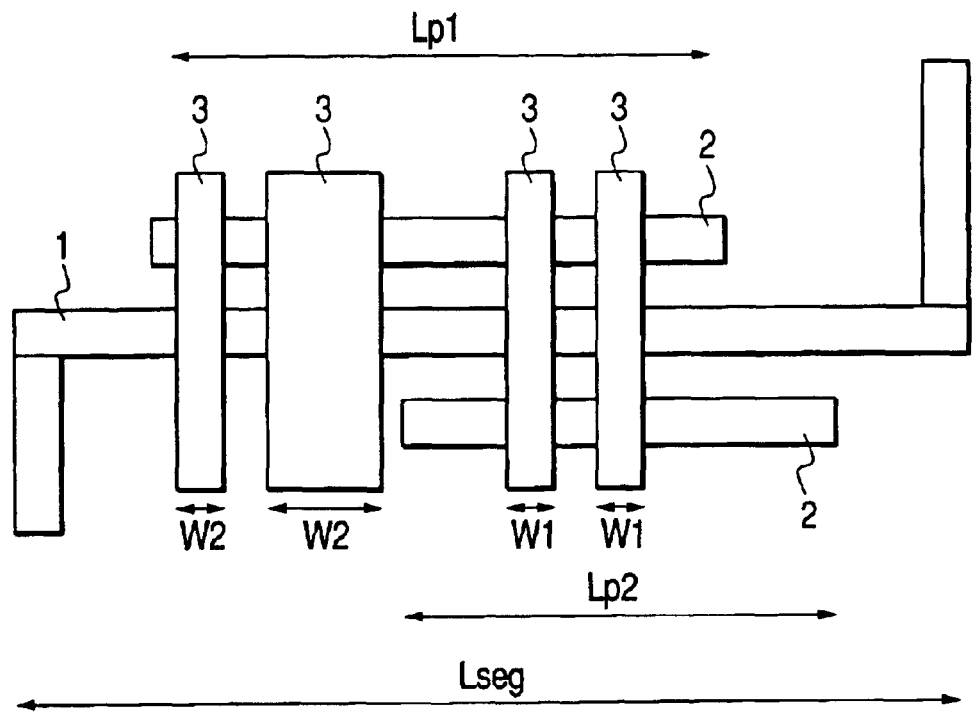
FIG. 10 is a diagram used to explain the calculation of capacitance of segments based on an embodiment of this invention.
FIG. 11 is a diagram showing the two-dimensional table addressed by the modulus of parallelismed modulus of crossing based on an embodiment of this invention.

Next, a manner of calculating the line capacitance based on an embodiment of this invention will be explained with reference to FIGS. 3A–3D through FIG. 11. FIGS. 3A through 3D are conceptual diagrams showing the behaviors of the subject line, adjacent line and cross line treated by an embodiment of this invention, FIG. 4 is a brief perspective view of models of a subject line, adjacent lines and cross lines treated by an embodiment of this invention, FIGS. 5A through 5C are brief cross-sectional diagrams showing models of a subject line and adjacent lines treated by an embodiment of this invention, FIGS. 6A through 6D are brief cross-sectional diagrams showing models of a subject line and cross lines treated by an embodiment of this invention, FIGS. 7A and 7B are diagrams used to explain the calculation of capacitance of unit length based on an embodiment of this invention, FIG. 8 is a characteristic graph showing the dependency of the subject line capacitance on adjacent lines and cross lines treated by an embodiment of this invention, FIGS. 9A and 9B are graphs used to explain the base capacitance of the subject line, the capacitance increment caused by adjacent lines, and the capacitance increment caused by cross lines, FIG. 10 is a diagram used to explain the calculation of capacitance of segments based on an embodiment of this invention, and FIG. 11 is a diagram showing the two-dimensional table addressed by the modulus of parallelismed modulus of crossing based on an embodiment of this invention;

First, the concept of line capacitance calculation based on this embodiment, which is intended to evaluate the capacitance of unit length of several line models with and without adjacent lines and various moduli of crossing, will be explained with reference to FIGS. 3A–3D. The evaluation of capacitance of unit length of each line model can be based on the simulation or the measurement of TEG (test element group).

The rate of increase of capacitance per unit length caused by the increase of modulus of crossing is large in the region of small modulus of crossing, whereas it is small in the region of large modulus of crossing. The rate of increase of capacitance per unit length caused by the increase of modulus of crossing is larger in this case without adjacent lines as compared with the case with adjacent lines. This trend is based on the fact that the electric field varies greatly in response to the presence or absence of neighboring lines when the neighboring line density is small, whereas the electric field is in a state of near saturation when the neighboring line density is large and its variation depending on the neighboring line density dulls.

Figure 3A:
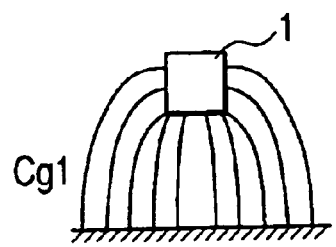
FIGS. 3A through 3D are conceptual diagrams showing the behaviors of the subject line, adjacent line and cross line treated by an embodiment of this invention.
Figure 3B:
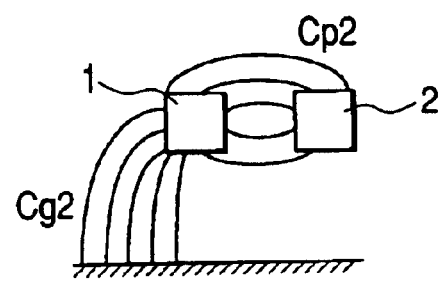
Figure 3C:
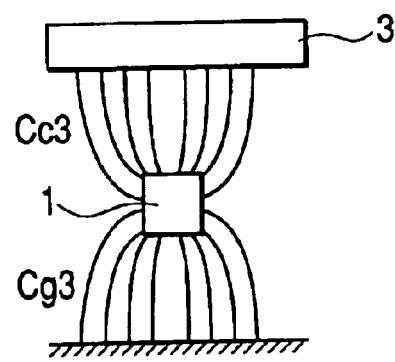
Figure 3D:
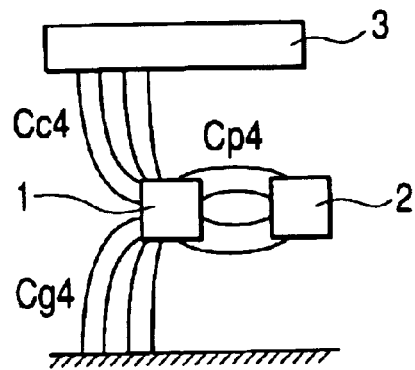

FIG. 3A shows the case of a sole subject line 1, FIG. 3B shows the case of a subject line 1 and an adjacent line 2, FIG. 3C shows the case of a subject line 1 and an upper cross line 3, and FIG. 3D shows the case of a subject line 1, an adjacent line 2 and an upper cross line 3.

In the presence of an adjacent line 2 shown in FIG. 3B, the subject line 1 having a parallel capacitance Cp2 with the adjacent line 2 has an increased total capacitance Cg2+Cp2, while it has a decreased line-to-ground capacitance, relative to the case of a sole subject line 1 shown in FIG. 3A. In the presence of an upper cross line 3 shown in FIG. 3C, the subject line 1 having a cross capacitance Cc3 with the upper cross line 3 has an increased total capacitance Cg3+Cc3, while it has a decreased line-to-ground capacitance, relative to the case of a sole subject line 1 shown in FIG. 3A. In the presence of an adjacent line 2 and an upper cross line 3 shown in FIG. 3D, the subject line 1 having a cross capacitance Cc4 with the upper cross line 3 has an increased total capacitance Cg4+Cp4+Cc4, while it has a decreased line-to-ground capacitance, relative to the case of FIG. 3B, and the subject line 1 having a parallel capacitance Cp4 with the adjacent line 2 has an increased total capacitance Cg4+Cp4+Cc4, while it has a decreased line-to-ground capacitance, relative to the case of FIG. 3C.

The capacitance increment $\Delta Cp$ caused by the adjacent line 2 is evaluated as a difference between the case of FIG. 3A and the case of FIG. 3B as follows.

$$\Delta Cp2 = (Cg2 + Cp2) - Cg1$$

On the other hand, it is evaluation as a difference between the case of FIG. 3C and the case of FIG. 3D as follows.

$$\Delta Cp4 = (Cg4 + Cp4 + Cc4) - (Cg3 + Cc3) < \Delta Cp2$$

Namely, the value of $\Delta Cp$ varies depending on the presence or absence (modulus of crossing) of the cross line 3, i.e., depending on the calculation model.

The capacitance increment $\Delta Cc$ caused by the cross line 3 is evaluated as a difference between the case of FIG. 3A and the case of FIG. 3C as follows.

$$\Delta Cc3 = (Cg3 + Cc3) - Cg1$$

On the other hand, it is evaluation as a difference between the case of FIG. 3B and the case of FIG. 3D as follows.

$$\Delta Cc4 = (Cg4 + Cp4 + Cc4) - (Cg2 + Cp2) < \Delta Cc3$$

Namely, the value of $\Delta Cc$ varies depending on the presence or absence (modulus of parallelism) of the adjacent line 2, i.e., depending on the calculation model.

The relation among these capacitance values are arranged as follows.

$Cg1 > Cg2 > Cg4$ $Cg1 > Cg3 > Cg4$ $Cp2 > Cp4$ $Cc3 > Cc4$ $Cg1 < (Cg2 + Cp2) < (Cg4 + Cp4 + Cc4)$ $Cg1 < (Cg3 + Cc3) < (Cg4 + Cp4 + Cc4)$ $\Delta Cp2 = (Cg2 + Cp2) - Cg1$ $\Delta Cc3 = (Cg3 + Cc3) - Cg1$ $\Delta Cp4 = (Cg4 + Cp4 + Cc4) - (Cg3 + Cc3) < \Delta Cp2$ $\Delta Cc4 = (Cg4 + Cp4 + Cc4) - (Cg2 + Cp2) < \Delta Cc3$ Subsequently, Cbase, ΔCpara and ΔCross are evaluated based on the dependency of line capacitance on the presence or absence of the adjacent line 2 and the modulus of crossing of the cross line 3. The constants of Cbase, ΔCpara and ΔCross are defined depending on their purpose. For example, in order to have a calculated capacitance value that is surely larger than the actual capacitance value for the safe design, ΔCross is evaluated from the slope of graph of Ctotal in the region of large modulus of crossing of the case of the presence of adjacent lines 2 on both sides of the subject line, ΔCpara is evaluated from the difference of the cases of adjacent line on one side or lines on both sides of the subject line, and Cbase is evaluated reversely from the ΔCross and ΔCpara. In order to have a calculated capacitance value relevant to a nominal line density, ΔCross is evaluated from the slope of graph at a position close to the intended line density.

Alternatively, it is possible to make a table or formulate a function which presents the dependency of line capacitance Ctotal on the presence or absence of the adjacent line 2 and the modulus of crossing of the cross line 3 evaluated as explained above. In this case, Cbase, ΔCpara and ΔCross can be defined irrespective of the purpose, and the calculated capacitance is accurate for any line density.

Next, the procedure of calculating the line capacitance will be explained with reference to FIG. 4 through FIG. 11 for a specific example of model including a subject line 1, adjacent lines 2 and cross lines 3.

(1) The line capacitance of unit length is evaluated for several models which are subject lines with and without adjacent lines 2 and having various moduli of crossing of cross lines 3. For example, 12 kinds of models are dealt with, which are subject lines without adjacent line, with an adjacent line on one side and with adjacent lines on both sides and having moduli of crossing of 0%,33%,67% and 100%. The modulus of crossing basis its value on 100% at which cross lines are laid in the highest density at an allowable line pitch. Specifically, in case cross lines are laid to have a line width to spacing ratio of 1:1 at a modulus of crossing of 100%, it means that the line area takes up 50%.

FIG. 4 shows an example including a subject line 1, adjacent lines 2 and upper-layer cross lines 3. There are three cases in which the subject line has no adjacent line, has an adjacent line on one side, and has adjacent lines on both sides (along the x direction in FIG. 4) as shown by FIG. 5A,5B and FIG. 5C, respectively. In each case, the upper-layer cross lines 3 (along the y direction in FIG. 4) have moduli of crossing of 0%,33%,67% and 100% as shown by FIGS. 6A,6B,6C and 6D, respectively. These are the 12 kinds of models.

(2) ΔCcross is evaluated based on the slope of capacitance values obtained in (1) plotted against the moduli of crossing, ΔCpara is evaluated based on the difference between the capacitance values with adjacent line on one side and with lines on both sides, and Cbase is calculated reversely from these values.

For example, in FIGS. 7A and 7B, the total capacitance (Ctotal) per unit length (1 mm) is calculated by converting the line-to-ground capacitance Cg into the value of 1 mm, converting the capacitance Cp of adjacent line 2 into the value of 1 mm, calculating the number of cross lines 3 equivalent to the same line density as the model for 1 mm (e.g., 4(lines)/100($\mu$m)×1(mm)) and multiplying it to the capacitance Cc of one cross line.

$$Ctotal = Cg/100\ \mu m \times 1\ mm + Cp/100\ \mu m \times 1\ mm + Cc \times 4/100\ \mu m \times 1\ mm \quad (1)$$

The total capacitance values Ctotal per unit length, with the number of adjacent lines 2 and the modulus of crossing of the upper-layer cross lines 3 being varied (in correspondence to FIGS. 5A–5C and FIGS. 6A–6D), are plotted on a graph as shown in FIG. 8.

FIG. 8 reveals that the rate of increase of capacitance per unit length caused by the increase of modulus of crossing is large in the region of small modulus of crossing, whereas it is small in the region of large modulus of crossing. The rate of increase of capacitance per unit length caused by the increase of modulus of crossing is larger in the case without adjacent lines as compared with the case with adjacent lines.

Based on FIG. 8, ΔCcross is evaluated from the slope of capacitance values plotted against the moduli of crossing, ΔCpara is evaluated based on the difference between the capacitance values with adjacent line on one side and lines on both sides, and Cbase is calculated reversely from these values. The Cbase value differs depending on the manner of evaluation of ΔCcross as shown in FIGS. 9A and 9B.

(3) The length of the subject line 1, the length of parallel section of the adjacent lines 2, and the length (width multiplied by the number of lines) of the cross lines 3 are obtained from the net list. Since lines running in the x and y directions are usually laid on different layers, layers are swapped based on the bearing of lines. Lines on different layers can have different capacitance values, and each line is treated as a number of segments partitioned based on the bearing. Accordingly, the lengths of subject line, adjust parallel lines and cross lines are evaluated for individual segments of lines in general.

(4) The capacitance of segment is evaluated in terms of: Cbase multiplied by segment length, plus ΔCpara multiplied by parallel line length, plus ΔCcross multiplied by cross line length. The segment capacitance for an example of lines of FIG. 10 is calculated by the following expression.

$$Cseg = Cbase \times Lseg/1\ mm + \Delta Cpara \times (Lp1 + Lp2)/1\ mm + \Delta Ccross \times (W1 \times 3 \times W2 \times 1)/1\ mm \quad (2)$$

(5) In place of the capacitance calculation of the item (2), a two-dimensional table of capacitance values in relation with parameters of the modulus of crossing and the number of adjacent lines (modulus of parallelism), is made directly from the capacitance values resulting from the item (1). For example, a table shown in FIG. 11 releases a capacitance value for inputs of the row of modulus of crossing among 0%,10%, 33%, 67% and 100% and the column of modulus of parallelism among 0% (no adjacent line), 100% (adjacent line on one side), and 200% (adjacent lines on both sides).

(6) The length of the subject line 1, the parallel length, and the modulus of crossing of cross lines 3 are obtained from the net list. Since lines running in the x and y directions are usually laid on different layers, layers are swapped based on the bearing of lines. Lines on different layers can have different capacitance values, and each line is treated as a number of segments partitioned based on the bearing. Accordingly, the lengths of subject line, adjust parallel lines and cross lines are evaluated for individual segments of lines in general.

For the example of lines shown in FIG. 10, the modulus of parallelism, modulus of crossing and line occupancy factor * are calculated as follows.

$$\text{Modulus of parallelism} = (Lp1+Lp2)/Lseg \quad (3)$$

$$\text{Modulus of crossing} = (W1 \times 3 + W2 \times 1)/Lseg/\alpha \quad (4)$$

$$\alpha = (\text{Line width})/(\text{line width} + \text{spacing}) \quad (5)$$

(7) Capacitance values of segments of unit length are evaluated based on the modulus of parallelism and modulus of crossing obtained in item (6), and multiplied to the segment lengths to evaluate capacitance values of segments. A modulus of parallelism or modulus of crossing which is absent in the table is calculated based on the linear or n-degree functional interpolation or extrapolation with respect to two nearby points.

(8) In place of the table of item (5), an approximate equation of capacitance value having two variables of the modulus of crossing and modulus of parallelism is formulated based on the capacitance values resulting from the item (1).

(9) Capacitance values of segments of unit length are evaluated based on the modulus of parallelism and modulus of crossing obtained in item (8), and multiplied to segment lengths to evaluate capacitance values of segments.

In the line capacitance calculation scheme explained above, capacitance values are set up in a library which is a table addressed in terms of a modulus of crossing and a modulus of parallelism, or a function having two variables of the modulus of crossing and modulus of parallelism. Data of the table or function is stored in a storage medium, e.g., CD-ROM, and read out by the computer of LSI design system.

The line capacitance calculation scheme intended for the LSI design evaluates capacitance values of several samples for moduli of crossing and moduli of parallelism and sets up resulting data in a library. It enables the evaluation of parasitic capacitance of line at a high speed and high accuracy. The library can be established based on the simulation using as many as 20 samples for each type of line (layer, line width and line interval). The accurate calculation of parasitic capacitance enhances the calculation accuracy of signal propagation time.

Following the explanation of the manner of evaluating accurately the line-to-ground capacitance based on the neighboring line density to be used for the delay calculation, a manner of calculating the coupling capacitance which is also responsive to the neighboring line density will be explained. The line-to-ground capacitance is defined separately in terms of a base capacitance inherent to the existence of subject line, a cross capacitance increment caused by cross lines, and a parallel capacitance increment caused by parallel lines.

Figure 18A:
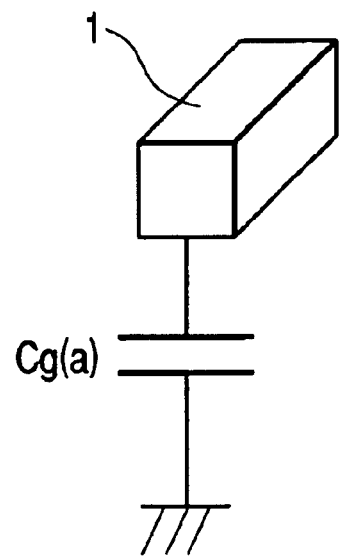
FIGS. 18A and 18B are conceptual diagrams showing the behaviors of the subject line and adjacent lines treated by the delay calculation scheme which considers the line-to-ground capacitance and coupling capacitance based on an embodiment of this invention.
Figure 18B:
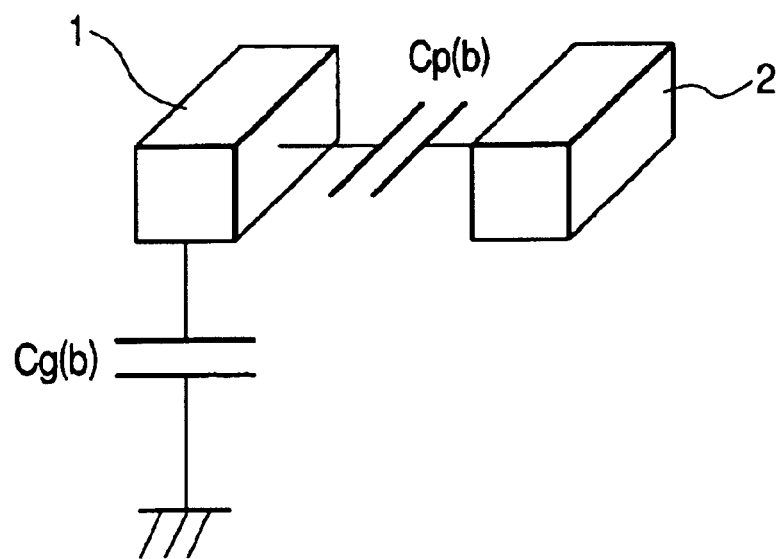
Figure 19:
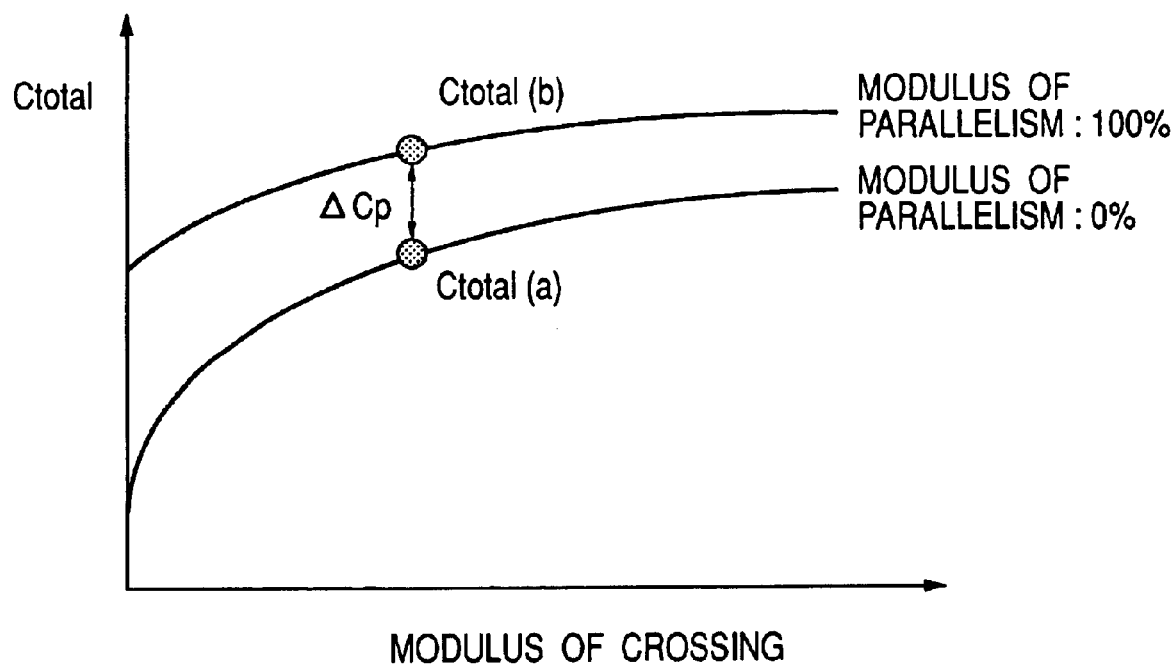
FIG. 19 is a characteristic graph showing the dependency of the total capacitance on the modulus of crossing treated by an embodiment of this invention.
Figure 20:
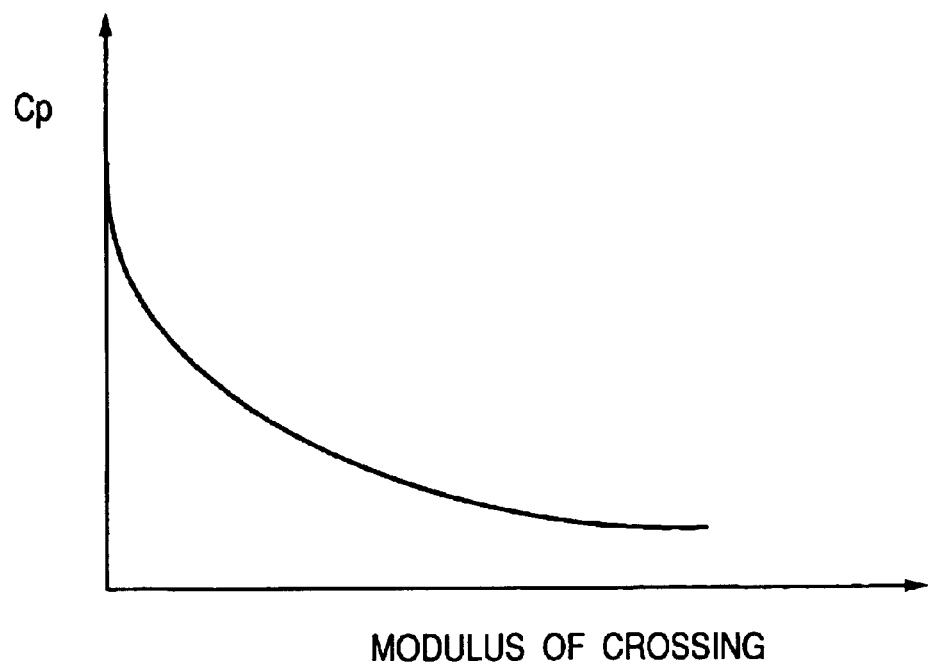
FIG. 20 is a characteristic graph showing the dependency of the coupling capacitance on the modulus of crossing treated by an embodiment of this invention.
Figure 21:
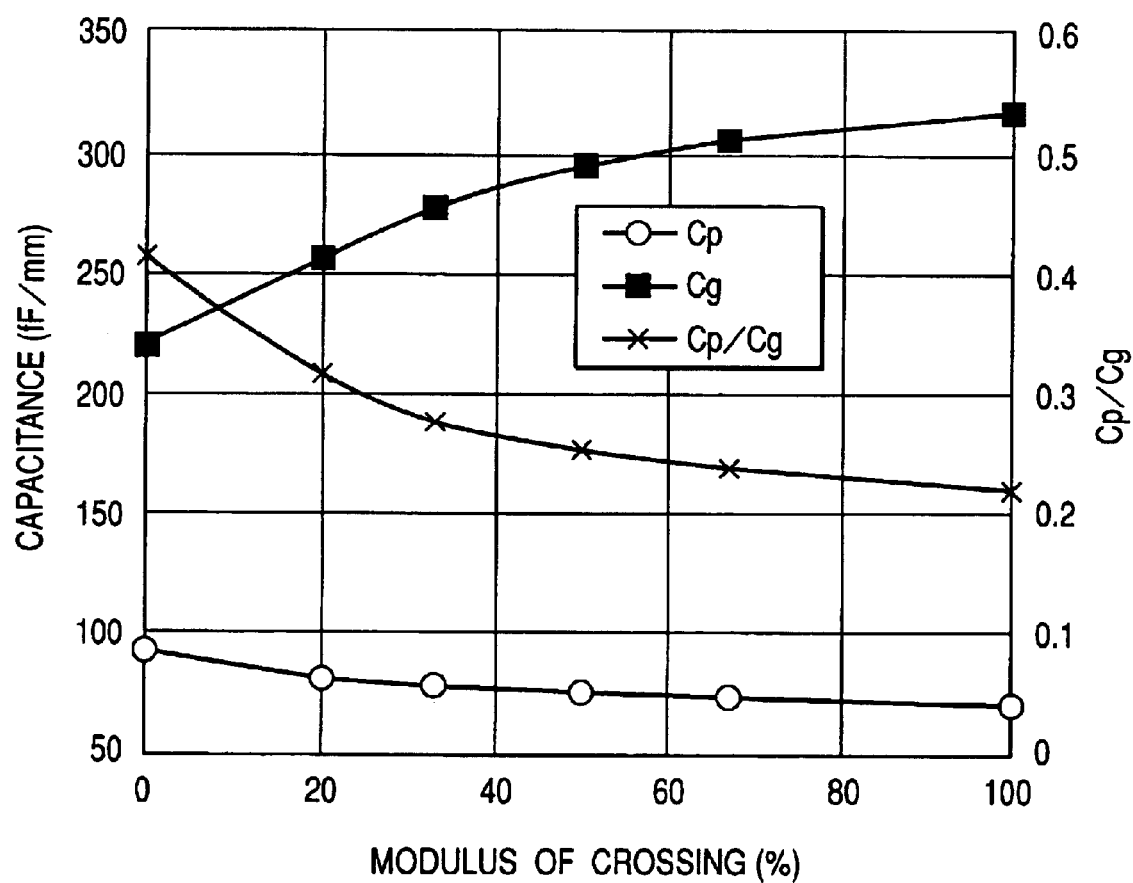
FIG. 21 is a characteristic graph showing the dependency of the noise on the modulus of crossing treated by an embodiment of this invention.
Figure 22:
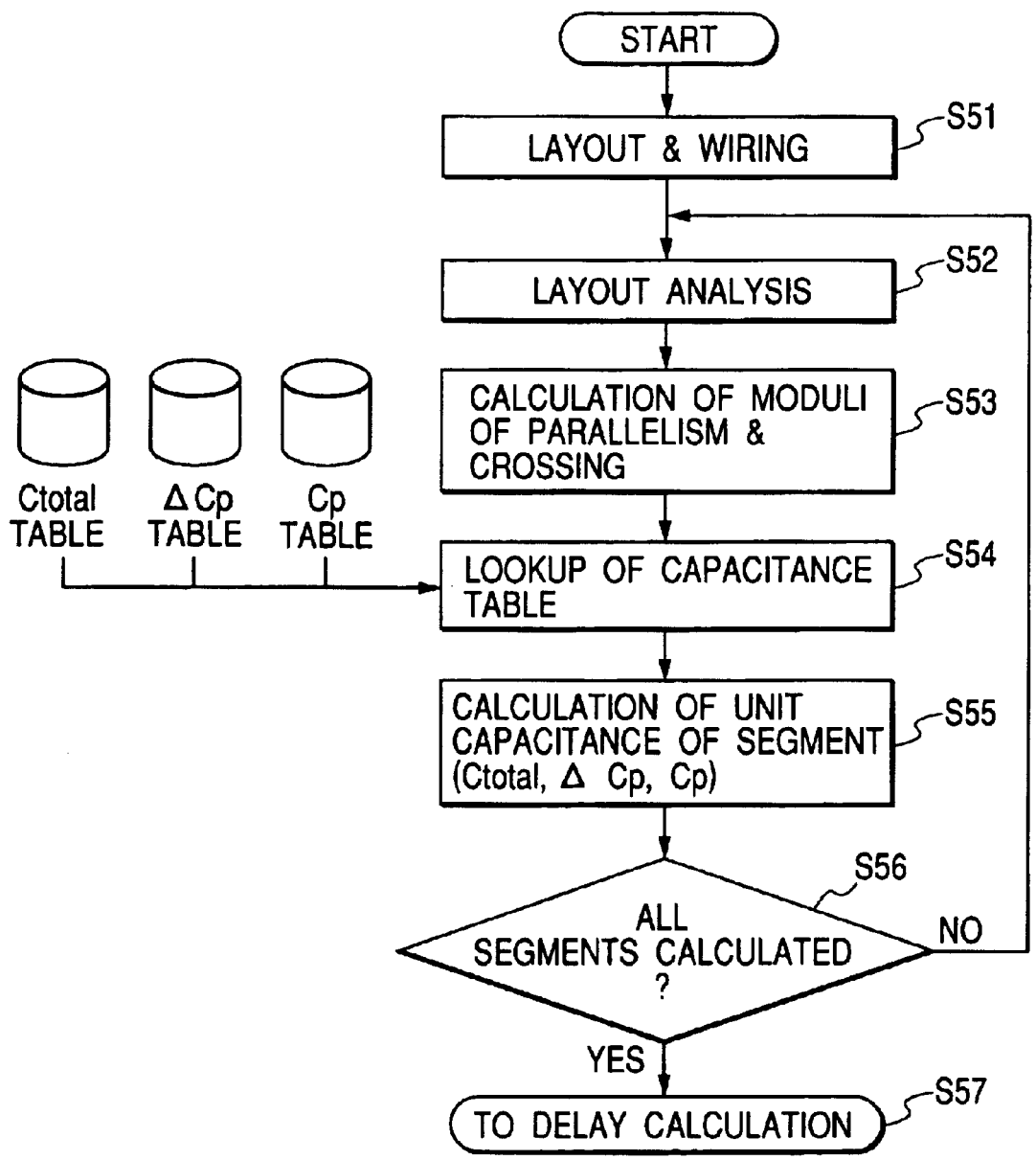
FIG. 22 is a flowchart showing the design procedure of delay calculation in consideration of the line-to-ground capacitance and coupling capacitance based on an embodiment of this invention.
Figure 23:
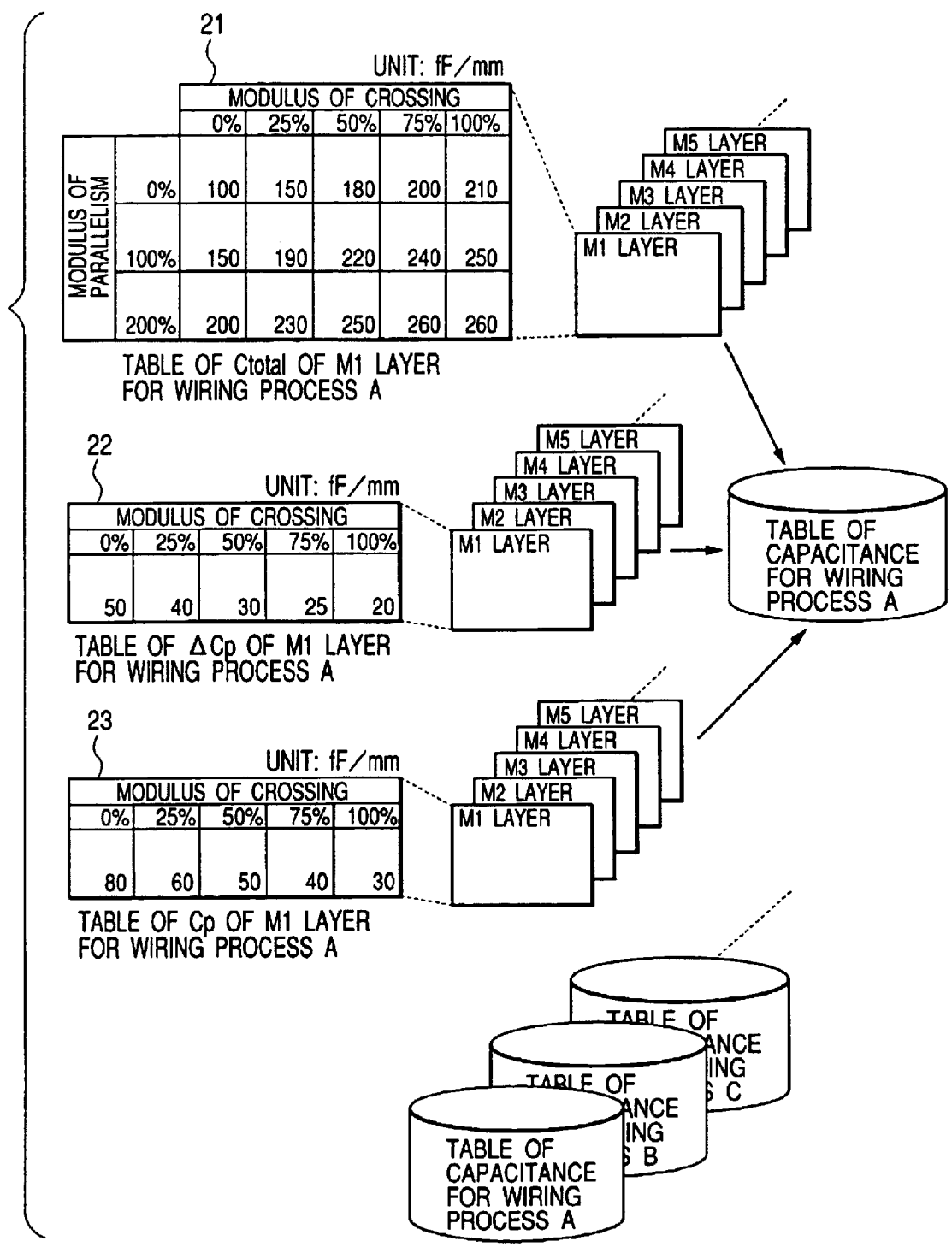
FIG. 23 is a block diagram used to explain the capacitance tables based on an embodiment of this invention.

A manner of delay calculation in consideration of the line-to-ground capacitance and coupling capacitance based on an embodiment of this invention will be explained with reference to FIGS. 18A and 18B through FIG. 23. FIGS. 18A and 18B are conceptual diagrams showing the behaviors of the subject line and adjacent lines treated by the delay calculation scheme which considers the line-to-ground capacitance and coupling capacitance based on an embodiment of this invention, FIG. 19 is a characteristic graph showing the dependency of the total capacitance on the modulus of crossing treated by an embodiment of this invention, FIG. 20 is a characteristic graph showing the dependency of the coupling capacitance on the modulus of crossing treated by an embodiment of this invention, FIG. 21 is a characteristic graph showing the dependency of the noise on the modulus of crossing treated by an embodiment of this invention, FIG. 22 is a flowchart showing the design procedure of delay calculation in consideration of the line-to-ground capacitance and coupling capacitance based on an embodiment of this invention, and FIG. 23 is a block diagram used to explain the capacitance tables based on an embodiment of this invention.

First, the concept of the manner of delay calculation in consideration of the line-to-ground capacitance and coupling capacitance will be explained.

(11) For the regular-pitch line layout at a minimum pitch determined by the layout tool, the capacitance of unit length of several line models of various adjacent line density and various cross line density with the assumption of grounding of all lines except for the subject line are evaluated. For several line models of various cross line density, the difference of Ctotal between the cases with and without adjacent lines is evaluated as capacitance increment $\Delta Cp$.

In an example shown in FIG. 18A, the total capacitance Ctotal is derived from the capacitance with the assumption of grounding of all lines except for the subject line 1, i.e., Ctotal(a)=Cg(a).

In another example shown in FIG. 18B, the capacitance increment $\Delta Cp$ is derived from an increase of Ctotal due to the presence of adjacent line 2 of the subject line 1, and the coupling capacitance Cp is derived from the capacitance formed by the subject line 1 and adjacent line 2. Cp is unequal to $\Delta Cp (Cp > \Delta Cp)$.

$$Ctotal(b) = Cg(b) + Cp(b)$$

$$\Delta Cp(b) = Ctotal(b) - Ctotal(a)$$

$$= Cg(b) + Cp(b) - Cg(a)$$

As Cg(a) is greater than Cg(b), $\Delta Cp(b)$ is not greater than Cp(b).

(12) In a preparatory procedure, total capacitance values (Ctotal) of unit length are registered in relation with parameters in terms of the modulus of parallelism and modulus of crossing in a library table, coupling capacitance values Cp of unit length are registered in relation with a parameter in terms of the modulus of crossing in a library table, and capacitance increment values $\Delta Cp$ of unit length are registered in relation with a parameter in terms of the modulus of crossing.

In an example shown in FIG. 19, Ctotal used for delay calculation varies depending on the neighboring line density. The capacitance value of unit length is defined as a function of parameters in terms of the modulus of crossing and modulus of parallelism and set up in a table, and the table is looked up in response to a modulus of crossing and a modulus of parallelism provided by the actual net list. A resulting capacitance value of unit length is multiplied to the parallel line length to evaluate the Ctotal.

$\Delta Cp$, which is evaluated as the difference of moduli of parallelism of 100% and 0%, varies depending on the modulus of crossing, and it is defined in terms of the capacitance per unit length as a function of a parameter in terms of the modulus of crossing. The table is looked up in response to a modulus of crossing obtained from the actual net list, and a resulting capacitance value of unit length is multiplied to the parallel line length to evaluate the $\Delta Cp$.

In an example shown in FIG. 20, Cp used for the calculation of crosstalk noise varies depending on the modulus of crossing, and it is defined in terms of the capacitance per unit length as a function of a parameter in terms of the modulus of crossing. The table is looked up in response to a modulus of crossing obtained from the actual net list, and a resulting capacitance value of unit length is multiplied to the parallel line length to evaluate the Cp.

Similarly, the line-to-ground capacitance Cg used for the calculation of crosstalk noise voltage varies depending on the modulus of crossing, and it can be defined in terms of the capacitance per unit length as a function of a parameter in terms of the modulus of crossing.

In regard to the coupling capacitance Cp and line-to-ground capacitance Cg, the crosstalk noise generation level is dependent on the value of Cp/Cg as shown by an example of FIG. 21 (also described in Japanese Patent Unexamined Publication No. Hei 5(1993)-342305). In the region of small modulus of crossing, the value of Cp/Cg is large and the noise level is also high. In the prior art scheme, in which variable moduli of crossing are not taken into account for calculation, e.g., the values of Cp and Cg at a 50% modulus of crossing are used constantly, if the subject line has a modulus of crossing of 0% in the actual net list, the Cp/Cg value would be underestimated, resulting possibly in the failure of detection of malfunctioning caused by a crosstalk noise. Whereas, the present invention enables much accurate estimation of the noise generation level.

Next, the design procedure of delay calculation, with the line-to-ground capacitance and coupling capacitance being considered, based on an embodiment of this invention will be explained in connection with FIG. 22 and FIG. 23.

(21) Following the layout and wiring, the line layout is analyzed based on the produced net list: (steps S51, S52). Data of parallel lines and upper and lower cross lines is collected in this analysis.

(22) The length of subject line, modulus of parallelism and modulus of crossing are obtained from the net list: (step S53). The modulus of parallelism is the total length of adjacent lines divided by the length of subject line, and the modulus of crossing basis the value on 100% at which cross lines are laid in the highest density at an allowable line pitch, e.g., in case cross lines are laid to have a line width to spacing ratio of 1:1 at a modulus of crossing of 100%, it means that the line area takes up 50%.

(23) The total capacitance Ctotal of unit length relevant to the combination of the obtained modulus of parallelism and modulus of crossing, the coupling capacitance Cp of unit length relevant to the modulus of crossing, and the capacitance increment $\Delta$Cp of unit length relevant to the modulus of crossing are evaluated based on the extrapolation process for the registered data in a table 21 of Ctotal, table 22 of A Cp, and table 23 of Cp:(step S54).

For example, in an example shown in FIG. 23, a library of capacitance tables are made for individual wiring processes (A), (B), (C), and so on. Each wiring process uses a table 21 of Ctotal, table 22 of $\Delta$Cp and table 23 of Cp for each wiring layer. For example, the wiring process (A) has its Ctotal table 21 for the first metallic wiring layer (M1 layer) containing capacitance values relevant to moduli of parallelism of 0%, 100% and 200% and moduli of crossing of 0%,25%,50%,75% and 100%. The process (A) has its $\Delta$Cp table 22 and Cp table 23 containing capacitance values relevant to moduli of crossing of 0%,25%,50%,75% and 100%.

The wiring process (A) has identical Ctotal tables, A Cp tables and Cp tables for the second metallic wiring layer (M2 layer) and third metallic wiring layer (M3 layer), and so on.

The wiring processes (B), (C), and so on, also have Ctotal tables, $\Delta$Cp tables and Cp tables identical to those of the wiring process (A).

(24) The length of subject line (segment) is multiplied to the obtained Ctotal, $\Delta$Cp and Cp of unit length thereby to evaluate the total capacitance Ctotal, capacitance increment $\Delta$Cp and coupling capacitance Cp of segment: (step S55). The processes from step S52 are repeated until the end of calculation of all segments judged at step S56.

(25) On completion of calculation of the total capacitance Ctotal, capacitance increment $\Delta$Cp and coupling capacitance Cp for all segments, the sequence proceeds to step S57 for delay calculation. The manner of delay calculation described in Japanese Patent Unexamined Publication No. Hei 8(1996)-6990 or No. Hei 8(1996)-77243, for example, can be used. The value of delay, with the parallel lines being removed while the layout and subject line being left unchanged, can be evaluated by the replacement of the capacitance increment A Cp with a library data with $\Delta$Cp of 0.

In the foregoing delay calculation manner, with the line-to-ground capacitance and coupling capacitance being considered, delay variation values and various design parameters for each combination of characteristics derived from wiring layers of parallel lines, line widths and line spacings are set up in a library and stored as computer data in a storage medium, so that LSI devices are designed by use of the stored data.

In the delay calculation manner, with the line-to-ground capacitance and coupling capacitance being considered, for the LSI design, the coupling capacitance varies depending on the presence or absence (density) of neighboring lines, besides the thickness and distance of two lines and the dielectric constant of insulator, and therefore based on the prior determination of the relation between the number of neighboring lines (upper and lower cross lines) and the coupling capacitance, it is possible to implement the fast calculation of coupling capacitance by being responsive to density of neighboring lines. Furthermore, based on the definition of line-to-ground capacitance separately in terms of the components, it becomes possible by merely altering the library to infer easily the performance estimation of the case of removal of all parallel lines by wiring control.

As a result, it becomes possible to known accurately the degree of influence of crosstalk on an LSI device at the time of design. It is possible to predict the maximum performance of an LSI device resulting from wiring control such as the removal of adjacent lines, and accordingly it is possible to know prior to the modification of wiring the potential performance which is determined from the number of logic stages and layout.

The influence of crosstalk on an LSI device will become much more serious due to the trends of microstructured lines and speed-up of operation, and therefore it is necessary to enhance the accuracy of assessment of delay variation and detection of nets with the possibility of malfunctioning. Since the coupling capacitance between the source and recipient of crosstalk determines the degree of crosstalk, the accurate evaluation of coupling capacitance will eventually enhance the above-mentioned accuracy of assessment and detection.

The coupling capacitance and crosstalk influence decrease in areas of crowded lines, whereas the coupling capacitance and crosstalk influence increase in areas of scarce lines. On this account, it is necessary to evaluate the coupling capacitance accurately by being responsive to the density of neighboring lines.

Although the total capacitance Ctotal of the case with parallel lines is larger than that of the case without parallel lines, their difference is smaller than the coupling capacitance. Therefore, based on the definition of the increase of total capacitance due to the presence of parallel lines in terms of the capacitance increment $\Delta$Cp, it is possible to predict the total capacitance of the case without parallel lines without the need of actual removal of parallel lines, but by the replacement with a library data with $\Delta$Cp of 0. In consequence, it becomes possible to predict the maximum enhancement of performance prior to the modification of wiring.

Figure 12:
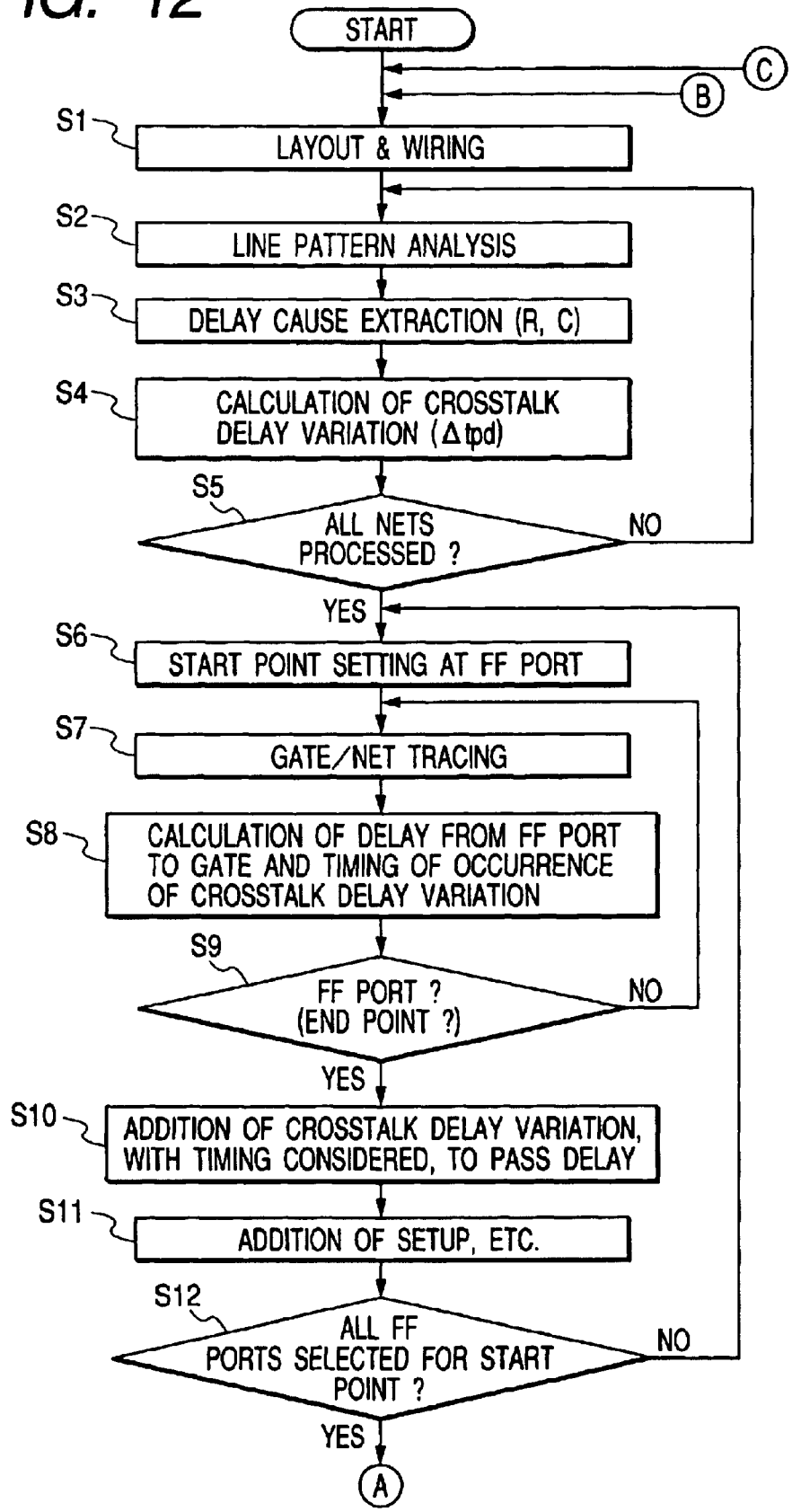
FIG. 12 is a flowchart showing the former part of one design procedure of crosstalk delay calculation based on an embodiment of this invention.
Figure 13:
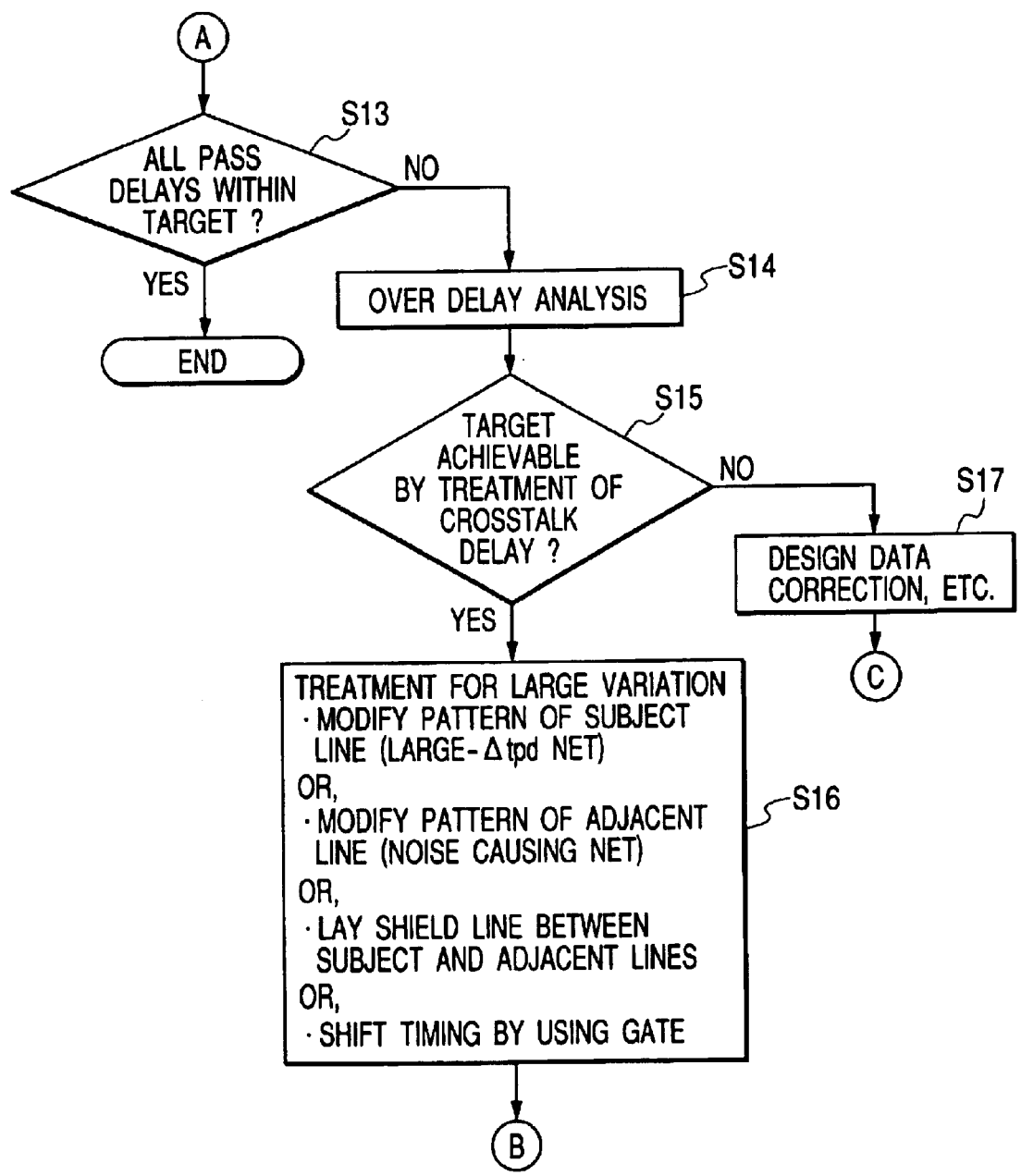
FIG. 13 is a flowchart continuous to FIG. 12, showing the latter part of the design procedure.
Figure 14:
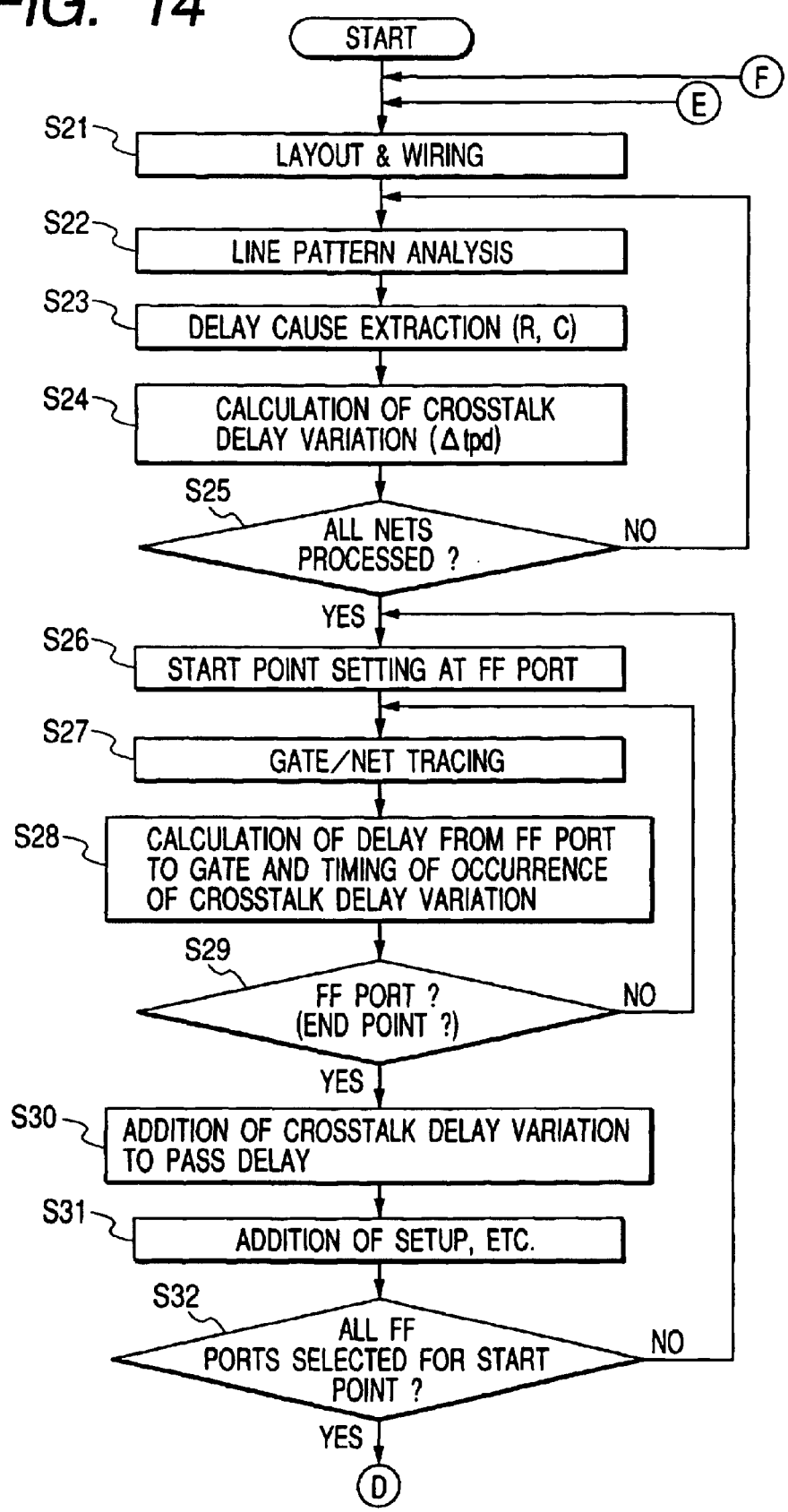
FIG. 14 is a flowchart showing the former part of another design procedure of crosstalk delay calculation based on an embodiment of this invention.
Figure 15:
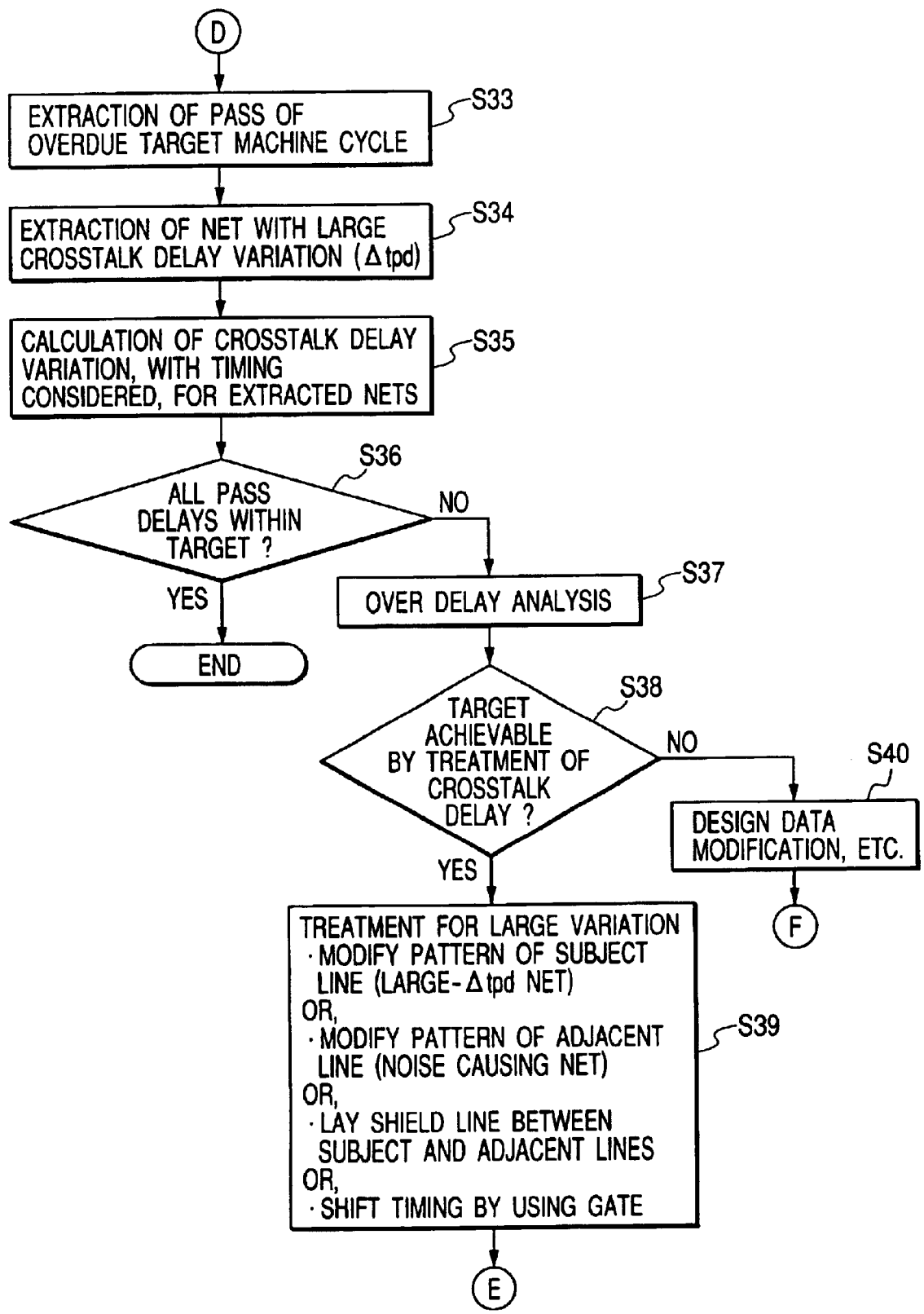
FIG. 15 is a flowchart continuous to FIG. 14, showing the latter part of the design procedure.
Figure 16A:
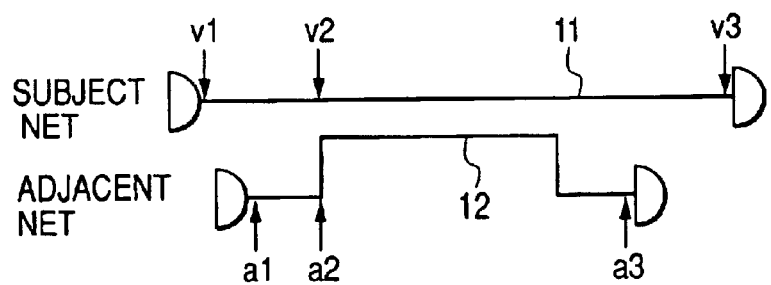
FIGS. 16A through 16C are diagrams used to explain the calculation of timing based on an embodiment of this invention.
Figure 16B:
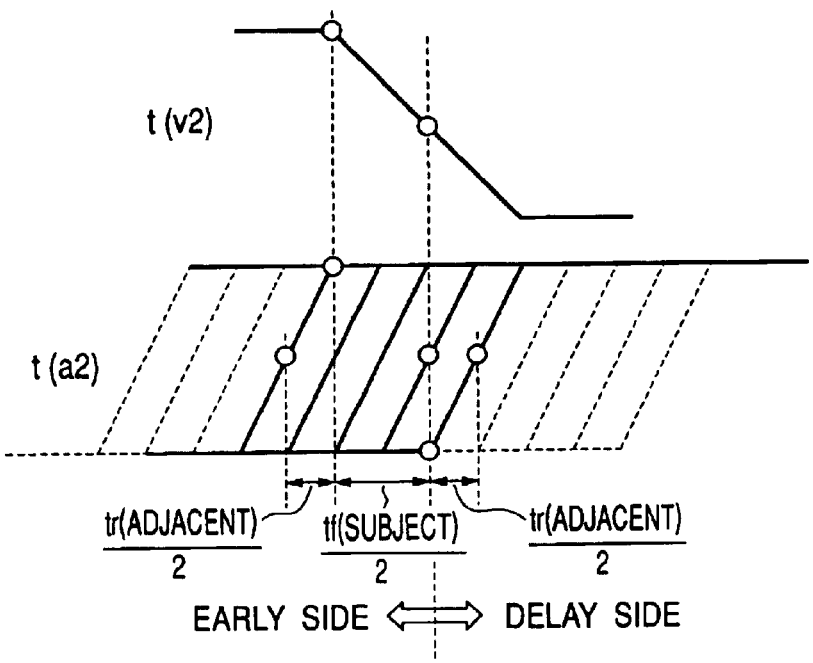
Figure 16C:
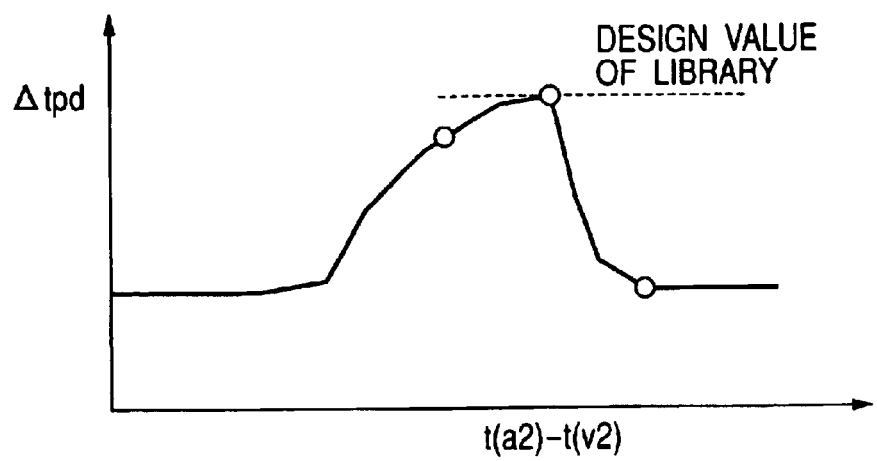
Figure 17:
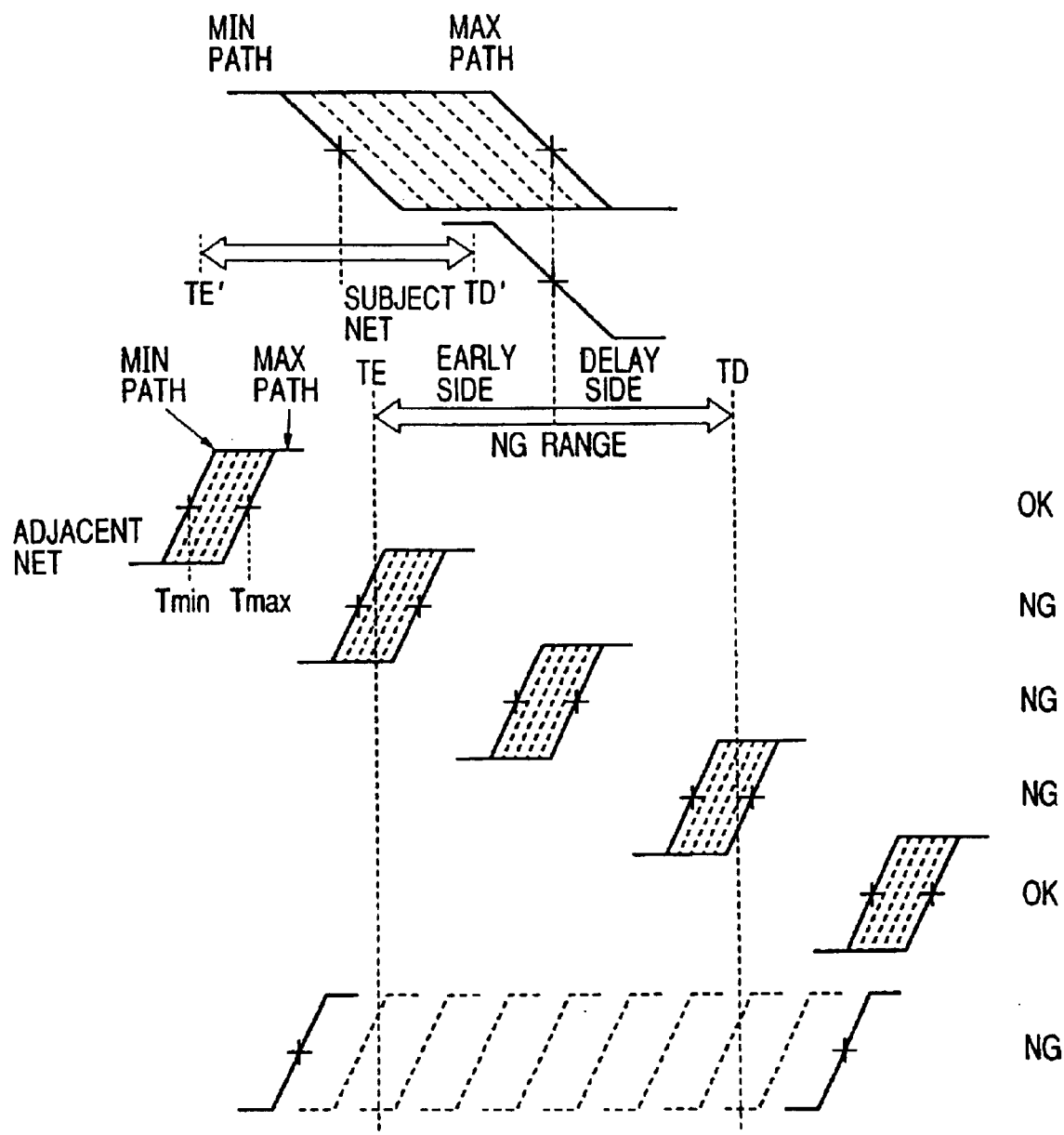
FIG. 17 is a diagram used to explain the assessment of timing based on an embodiment of this invention.

Next, the calculation scheme of crosstalk delay based on an embodiment of this invention will be explained with reference to FIG. 12 through FIG. 17. FIG. 12 is a flowchart showing the former part of one design procedure of crosstalk delay calculation based on an embodiment of this invention, FIG. 13 is a flowchart continuous to FIG. 12, showing the latter part of the design procedure, FIG. 14 is a flowchart showing the former part of another design procedure of crosstalk delay calculation based on an embodiment of this invention, FIG. 15 is a flowchart continuous to FIG. 14, showing the latter part of the design procedure, FIGS. 16A through 16C are diagrams used to explain the calculation of timing based on an embodiment of this invention, and FIG. 17 is a diagram used to explain the assessment of timing based on an embodiment of this invention.

First, the design procedure will be explained in connection with FIG. 12 and FIG. 13. A table of crosstalk delay variation values and a function table are prepared in advance. Delay variation values corresponding to parallel line positions and parallel lengths are defined for each set of the wiring layer of parallel line, line width and line spacing, or for each set of the capacitance between parallel lines, capacitance of noise recipient line (line-to-ground capacitance and cross line capacitance), capacitance of noise source line, resistance of noise recipient line, and resistance of noise source line.

(31) Following the layout and wiring, the line layout is analyzed based on the produced net list: (steps S1, S2). Data of parallel lines and upper and lower cross lines is collected in this analysis.

(32) Causes of delay (R: line resistance, C: line capacitance) are extracted based on the unit capacitance and resistance values registered in a library in advance and on the line layout analysis of item (31): (step S3).

(33) The delay variation value $\Delta tpd$ caused by the crosstalk is calculated based on the prepared function table and parallel line data collected in item (31): (step S4). The processes from step S2 are repeated until the end of processes for all nets is judged at step S5.

(34) The net is traced by starting at a flip-flop or port thereby to calculate the delay from the flip-flop or port up to a gate and the timing of occurrence of crosstalk delay variation: (steps S6–S8). Namely, the operation time measured from the flip-flop to each gate is evaluated.

(35) For each parallel line, it is judged as to whether the operation time of each source gate is within the timing of influence on the delay variation. The manner of judgement will be explained later. The processes from step S7 are repeated until the port of flip-flop is judged to be the end point at step S9.

(36) The delay variation caused by the crosstalk, with the timing being considered, is added to the pass delay: (step S10). Namely, $\Delta tpd$ of the parallel line which is influential on the delay variation is added to the pass delay.

(37) The setup, etc. are added: (step S11). The processes from step S6 are repeated until the judgement of selection of all flip-flops or ports for the start point is made at step S12.

(38) It is judged as to whether all pass delay values are within the target: (step S13) If this condition is met, the procedure terminates, or otherwise the cause of over delay is analyzed:(step S14).

(39) It is judged as to whether the target is attainable based on the treatment of crosstalk delay: (step S15). If it is attainable, the following process is carried out for a pass with a large variation. For example, the layout of subject line (large $\Delta tpd$ net) is modified, the layout of adjacent line (noise source net) is modified, shield lines are laid between the subject line and adjacent lines, or the timing is shifted by inserting gates, thereby reducing the crosstalk delay variation: (step S16). The sequence returns to step S1.

(40) If the target is not attainable by the treatment of crosstalk delay, design data is modified: (step S17), and the sequence returns to step S1.

Next, another design procedure for crosstalk delay calculation will be explained in connection with FIG. 14 and FIG. 15. This design procedure is intended to reduce the design time or simplify the process based on the calculation of delay variation value by pass extraction.

Steps S21 through S29 are identical to steps S1 through S9 of FIG. 12, steps S31 and S32 are identical to steps S11 and S12, and steps S36 through S40 are identical to step steps S13 through S17 of FIG. 13. The following explains the processes of remaining different steps.

(41) Step S30 adds crosstalk delay variation value to the pass delay. Timing is not considered in this procedure.

(42) Step S33 extracts a pass which is in excess of the target machine cycle. A net with a large crosstalk delay variation value $\Delta tpd$ is extracted, and the crosstalk delay variation value is calculated again in consideration of timing for the extracted net:(steps S34, S35). The same processes from step S36 as those of FIG. 13 take place.

Next, the timing calculation manner for crosstalk delay calculation will be explained in connection with FIGS. 16A,16B and 16C. The timing affected on delay by the crosstalk is calculated based on the delay at the source gate output point of the subject line 11 and adjacent line 12, the rise time tr and fall time tf, and the delay of subject line as follows.

$$-\{tr(\text{adjacent})/2+tf(\text{subject})/2\} \leq \{t(a2)-t(v2)\} \leq \{tr(\text{adjacent})/2\} \quad (6)$$

In FIG. 16A, the time points at which the voltages of nodes v1, v2 and v3 of the subject net 11 and nodes a1, a2 and a3 of the adjacent net 12 vary across a threshold voltage Vth are defined to be t (nodes). Since evaluation of delay at nodes a2 and v2 in the nets takes a long time and huge memory, it is alternatively evaluated based on t(a1), t(v1) and line delay as follows.

Although the time point t(v2) of node v2 of the subject net 11 and the time point t(a2) of node a2 of the adjacent net 12 vary depending on the parallel position, these time points are within the following range.

$$t(v1) \leq t(v2) \leq t(v3) = t(V1) + tpdR(\text{subject}) \quad (7)$$

$$t(a1) \leq t(a2) \leq t(a3) = t(a1) + tpdR(\text{adjacent}) \quad (8)$$

where, tpdR indicates the line delay.

In case the adjacent net 12 has a fan-out larger than or equal to 2 (multiple single gates), the maximum line delay is set to be tpdR(adjacent).

The range of (t(a1)-t(v1)) having influence on the delay of subject net 11 is given by FIG. 16B and expressions (7) and (8) as follows.

$$-\{tr(\text{adjacent})/2 + tf(\text{adjacent})/2 + tpdR(\text{adjacent})\} \leq \quad (9)$$
$$\{t(a1) - t(v1)\} \leq \{tr(\text{adjacent})/2 + tpdR(\text{subject})\}$$

This expression can be reformed by use of factors $\alpha$, $\beta$, $\gamma$ and $\delta$ as follows.

Early Side:

$$-\{\alpha \times tf(\text{subject}) + \beta \times tr(\text{adjacent}) + \gamma \times tpdR(\text{subject}) + \delta \times tpdR(\text{adjacent})\} \leq \{t(a1)-t(v1)\} \quad (10)$$

Delay Side:

$$\{t(a1)-t(v1)\} \leq \{\alpha \times tf(\text{subject}) + \beta \times tr(\text{adjacent}) + \gamma \times tpdR(\text{subject}) + \delta \times tpdR(\text{adjacent})\} \quad (11)$$

The factors α, β, γ and δ can be defined to have different values for the calculation of the early side and delay side and the calculation of the maximum delay and minimum delay.

The combination of tr and tf (signal rise time and fall time) used for the calculation of maximum delay is the rise of adjacent net 12 against the fall of subject net 11, and the fall of adjacent net 12 against the rise of subject net 11. For the calculation of minimum delay, these are the fall of adjacent net 12 against the fall of subject net 11 and the rise of adjacent net 12 against the rise of subject net 11.

The ranges obtained by the expressions (10) and (11) are set to be the range of NG, and among scattering values of crosstalk delay caused by the adjacent net 12, only values that are judged to be NG are added, while other crosstalk delay values that are judged to be OK are not added, based on the following criterion.

As a variant example, it is possible to define a table or function of Δtpd against (t(a2)-t(v2)), i.e., a table or function corresponding to FIG. 16C, instead of the logical NG/OK judgement.

Next, the manner of judgement of timing for crosstalk delay calculation will be explained in connection with FIG. 17. Among a number of routes from the starting flip-flop to the subject and adjacent nets, on which the operation times of both nets differ, the route on which the signal goes through in a shortest time is set to be MIN PATH, and the route on which the signal goes through in a longest time is set to be MAX PATH.

In FIG. 17, for the calculation of maximum delay on the MAX PATH of the subject net 11, the time span between the timing TE on the early side and the timing TD on the delay side is set to be the NG range. Accordingly, for timing Tmax of MAX PATH and timing Tmin of MIN PATH, the criterion for the adjacent net 12 is based on the following condition.

$$Tmax \geq TE \text{ AND } Tmin \leq TD \quad (12)$$

The adjacent net 12 is judged to be NG if the above condition is met, or otherwise it is judged to be OK.

Specifically, in regard to timings Tmin and Tmax of adjacent nets 12, an adjacent net 12 having its Tmin and Tmax emerging earlier than the timing TE of the subject net 11 and an adjacent net 12 having its Tmin and Tmax emerging later than the timing TD of the subject net 11 are judged to be OK, while an adjacent net 12 having its one or both of Tmin and Tmax emerging between the timing TE and timing TD is judged to be NG. Another adjacent net 12 having its Tmin emerging earlier than TE and its Tmax emerging later than TD is also judged to be NG.

For the calculation of minimum delay on the MIN PATH of the subject net 11, the timing TE' on the early side and the timing TD' on the delay side define the NG range. The rest is the same as the maximum delay.

In the foregoing crosstalk delay calculation manner, delay variation values and various design parameters for each combination of characteristics derived from wiring layers of parallel lines, line widths and line spacings are set up in a library and stored as computer data in a storage medium, so that LSI devices are designed by use of the stored data.

In the crosstalk delay calculation scheme for LSI design, only the crosstalk noise which actually causes the delay variation is considered in the calculation of delay inside the LSI, and accordingly an excessive margin at delay prediction can be eliminated. Namely, the occurrence of delay variation defined in the function table is confined to the case of operation of a crosstalk source signal within a certain time span before and after the operation of a crosstalk recipient signal, and accordingly it is not necessary to consider the influence of crosstalk source signals operating outside that time span. Only noises that actually affect the delay variation are considered, the delay variation becomes smaller than the counterpart of the conventional scheme, and the extra margin decreases. In consequence, it is possible to enhance the performance (operation speed) and reduce the power consumption.

Although the present invention has been described in connection with the specific embodiments, the invention is not confined to these embodiments, but various alterations are obviously possible without departing from the essence of the invention.

For example, it is possible for the foregoing line capacitance calculation scheme to convert the ratio of ΔCp values into the modulus of parallelism in case adjacent lines have different distances, or to have separate tables of capacitance of the upper and lower cross lines and sum the capacitance values.

It is possible for the crosstalk delay calculation scheme to have stressed display for the subject line and adjacent lines in need of modification, or redo the wiring automatically while freezing wiring data of other lines.

Among the affairs of the present invention disclosed in this specification, the major effectiveness is briefed as follows.

(1) In a design method of semiconductor devices, the coupling capacitance between two parallel lines and the increase of total capacitance due to the parallel lines are calculated based on the density of neighboring lines, whereby it is possible to enhance the accuracy of crosstalk noise calculation and accomplish high-accuracy checking of delay variation and malfunctioning caused by crosstalk. In consequence, it is possible to enhance the performance of semiconductor device.

What is claimed is:

1. A design method of semiconductor device comprising:
   a first step of calculating delay, judging as to whether or not a targeted in-cycle transfer is attainable, and laying out logic circuits, circuit elements and wirings between the logic circuits and the circuit elements repeatedly until the targeted in-cycle transfer becomes attainable;
   a second step of calculating the delay judging as to whether or not the targeted in-cycle transfer is attainable, and modifying the wirings repeatedly until the targeted in-cycle transfer becomes attainable;
   a third step of calculating a crosstalk noise level, judging as to whether or not malfunctioning occurs, and modifying the wirings repeatedly until malfunctioning subsides; and
   a fourth step of using data of the layout and wirings for mask data, the data of the layout and wirings being obtained by carrying out the third step,
   wherein when calculating the delay in the first step, an actual load of the semiconductor device after laying out the logic circuits, the circuit elements and the wirings is considered and a total capacitance (Ctotal) of a selected subject line of the wirings with the assumption of grounding of other lines of the wirings is used,
   wherein when calculating the delay in the second step, the actual load of the semiconductor device and crosstalk after carrying out the first step are considered and the total capacitance (Ctotal) is used, and
   wherein when calculating the crosstalk noise level, the actual load of the semiconductor device after carrying out the second step is considered and the total capacitance (Ctotal) and a coupling capacitance (Cp) between the subject line and an adjacent line are used.

2. A semiconductor device design method according to claim 1, wherein the first step further includes evaluating a capacitance increment (ΔCp) of the total capacitance (Ctotal) of the subject line for the cases with and without an adjacent line, modifying the layout and wirings route for a net which has a negative slack even in the case of no capacitance increment (ΔCp=O) of the case without an adjacent line, and removing an adjacent line for a net which has no negative slack in the case of no capacitance increment (ΔCp=O) of the case without an adjacent line, but has a negative slack in the case with a capacitance increment (ΔCp=O) of the case with an adjacent line.

3. A semiconductor device design method according to claim 2, wherein in evaluating the total capacitance (Ctotal), total capacitance values of unit length, with the assumption of the whole capacitance of the subject line to be the line-to-ground capacitance, are registered in advance in a table in relation with parameters in terms of modulus of parallelism and modulus of crossing, actual modulus of parallelism and actual modulus of crossing are calculated based on layout data after laying out the logic circuits, circuit elements and wirings, the total capacitance value of unit length corresponding to the calculated modulus of parallelism and modulus of crossing is evaluated based on the interpolation or extrapolation process for the contents of the table, and the length of the subject line is multiplied to the evaluated total capacitance of unit length, thereby evaluating the total capacitance (Ctotal).

4. A semiconductor device design method according to claim 3, wherein the total capacitance values of unit length registered in the table in relation with the parameters of modulus of parallelism and modulus of crossing are evaluated for an arbitrary number of models having different densities of adjacent lines and different densities of cross lines.

5. A semiconductor device design method according to claim 2, wherein in evaluating the coupling capacitance (Cp), coupling capacitance values of unit length between the subject line and the adjacent line are registered in advance in a table in relation with a parameter in terms of the modulus of crossing of the subject line, the actual modulus of crossing is calculated based on layout data after the logic circuits, the circuit elements and the wirings, the coupling capacitance of unit length corresponding to the calculated modulus of crossing is evaluated based on the interpolation or extrapolation process for the contents of the table, and the length of the subject line is multiplied to the evaluated coupling capacitance of unit length, thereby evaluating the coupling capacitance (Cp).

6. A semiconductor device design method according to claim 5, wherein the coupling capacitance values of unit length registered in the table in relation with the parameter of modulus of crossing are evaluated for an arbitrary number of models having different densities of adjacent lines and different densities of cross lines.

7. A semiconductor device design method according to claim 2, wherein in evaluating the capacitance increment (ΔCp), capacitance increment values of unit length due to the presence of adjacent lines out of the total capacitance (Ctotal) are registered in advance in a table in relation with a parameter in terms of modulus of crossing, actual modulus of crossing is calculated based on layout data after laying out the logic circuits, the circuit elements and the wirings, the capacitance increment of unit length corresponding to the calculated modulus of crossing is evaluated based on the interpolation or extrapolation process for the contents of the table, and the length of the subject line is multiplied to the evaluated capacitance increment of unit length, thereby evaluating the capacitance increment (ΔCp).

8. A semiconductor device design method according to claim 7, wherein the capacitance increment values of unit length registered in the table in relation with the parameter of modulus of crossing are evaluated for an arbitrary number of models having different densities of cross lines.

9. A semiconductor device design method according to claim 2, wherein the line-to-ground capacitance included in the total capacitance (Ctotal) is defined by being separated into a base capacitance inherent to the existence of the subject line, a cross capacitance increment caused by a cross line, and a parallel capacitance increment caused by an adjacent line.

10. A semiconductor device design method according to claim 3, wherein the subject line and adjacent line have aspect ratios of line cross section of 1 or larger.

11. A semiconductor device design method according to claim 4, wherein the subject line and adjacent line have aspect ratios of line cross section of 1 or larger.

12. A semiconductor device design method according to claim 5, wherein the subject line and adjacent line have aspect ratios of line cross section of 1 or larger.

13. A semiconductor device design method according to claim 6, wherein the subject line and adjacent line have aspect ratios of line cross section of 1 or larger.

14. A semiconductor device design method according to claim 7, wherein the subject line and adjacent line have aspect ratios of line cross section of 1 or larger.

15. A semiconductor device design method according to claim 8, wherein the subject line and adjacent line have aspect ratios of line cross section of 1 or larger.

* * * * *